(12) United States Patent
Brown et al.

(10) Patent No.: US 6,774,017 B2
(45) Date of Patent: Aug. 10, 2004

(54) METHOD AND STRUCTURES FOR DUAL DEPTH OXYGEN LAYERS IN SILICON-ON-INSULATOR PROCESSES

(75) Inventors: Jeffrey Scott Brown, Middlesex, VT (US); Andres Bryant, Essex Junction, VT (US); Robert J. Gauthier, Jr., Hinesburg, VT (US); Randy William Mann, Jericho, VT (US); Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/190,405

(22) Filed: Jul. 3, 2002

(65) Prior Publication Data

US 2002/0167050 A1 Nov. 14, 2002

Related U.S. Application Data

(62) Division of application No. 09/303,277, filed on Apr. 30, 1999, now Pat. No. 6,476,445.

(51) Int. Cl.[7] .......................... H01L 21/20; H01L 21/76
(52) U.S. Cl. .................. 438/480; 438/149; 438/311; 438/424; 438/427
(58) Field of Search .............................. 438/296, 311, 438/151, 149, 766, 480, 423, 427; 257/347

(56) References Cited

U.S. PATENT DOCUMENTS

| | | | |
|---|---|---|---|
| 3,381,182 A | 4/1968 | Thornton | |
| 3,411,200 A | 11/1968 | Formigoni | |
| 3,509,433 A | 4/1970 | Schroeder | |
| 4,472,240 A | 9/1984 | Kameyama | |
| 4,495,025 A | * 1/1985 | Haskell | 438/427 |
| 4,733,287 A | * 3/1988 | Bower | 257/508 |
| 4,753,896 A | * 6/1988 | Matloubian | 438/149 |
| 5,191,397 A | 3/1993 | Yoshida | |
| 5,279,978 A | * 1/1994 | See et al. | 438/154 |
| 5,364,800 A | 11/1994 | Joyner | |
| 5,463,238 A | * 10/1995 | Takahashi et al. | 257/351 |
| 5,484,738 A | 1/1996 | Chu et al. | |
| 5,523,602 A | 6/1996 | Horiuchi et al. | |
| 5,536,675 A | * 7/1996 | Bohr | 438/427 |
| 5,548,149 A | 8/1996 | Joyner | |
| 5,750,432 A | 5/1998 | McLachlan | |
| 5,760,442 A | 6/1998 | Shigyo et al. | |
| 5,807,771 A | * 9/1998 | Vu et al. | 438/154 |
| 5,893,744 A | * 4/1999 | Wang | 438/401 |
| 5,920,094 A | * 7/1999 | Nam | 257/347 |
| 5,930,642 A | * 7/1999 | Moore et al. | 438/407 |
| 5,978,259 A | * 11/1999 | Son et al. | 365/182 |
| 6,063,652 A | * 5/2000 | Kim | 438/155 |
| 6,083,797 A | * 7/2000 | Wong et al. | 438/296 |

* cited by examiner

Primary Examiner—Michael Trinh
(74) Attorney, Agent, or Firm—Schmeiser, Olsen & Watts; Anthony Canale

(57) ABSTRACT

A semiconductor structure, and associated method of fabrication, comprising a substrate having a continuous buried oxide layer and having a plurality of trench isolation structures. The buried oxide layer may be located at more than one depth within the substrate. The geometry of the trench isolation structure may vary with depth. The trench isolation structure may touch or not touch the buried oxide layer. Two trench isolation structures may penetrate the substrate to the same depth or to different depths. The trench isolation structures provide insulative separation between regions within the substrate and the separated regions may contain semiconductor devices. The semiconductor structure facilitates the providing of digital and analog devices on a common wafer. A dual-depth buried oxide layer facilitates an asymmetric semiconductor structure.

14 Claims, 14 Drawing Sheets

US 6,774,017 B2

METHOD AND STRUCTURES FOR DUAL DEPTH OXYGEN LAYERS IN SILICON-ON-INSULATOR PROCESSES

This application is a divisional of Ser. No. 09/303,277, filed on Apr. 30, 1999 now U.S. Pat. No. 6,476,445.

BACKGROUND OF THE INVENTION

1. Technical Field

The present invention relates to a semiconductor structure comprising a buried oxide layer and a plurality of trench isolation structures, and to a method for forming the semiconductor structure.

2. Related Art

A semiconductor structure typically comprises semiconductor devices, such as transistors, which need to be electrically isolated from other semiconductor devices. Various isolation structures, such as a buried oxide layer ("BOX") or a trench isolation structure ("trench"), have been used in semiconductor structures to accomplish such isolation. Viewing the vertical direction as into the depth, or thickness, of a given substrate and the horizontal direction as being parallel to a top surface of the substrate, a BOX is a horizontally oriented layer that provides insulative separation between semiconductor devices at different vertical locations, while a trench such as a shallow trench isolation is a vertically oriented structure that provides insulative separation between semiconductor devices at different horizontal locations.

A BOX comprises an oxide of an intrinsic semiconductor such as crystalline silicon and may be formed in various ways, such as by using oxygen ion implantation techniques which are known by those skilled in the art. A particular manner of using ion implantation to form a BOX of varying depth comprises: optionally "growing" a thin (e.g., 80 angstroms) pad oxide ($SiO_2$) layer on the top surface by exposing the top surface to oxygen at high temperature, depositing a thicker (e.g., 3000 angstroms) layer of silicon nitride ($Si_3N_4$) over the pad oxide, patterning the top surface with photoresist, exposing the top surface to ultraviolet radiation, etching the unexposed silicon nitride, implanting oxygen into the substrate, annealing, stripping away the silicon nitride layer, and stripping away the pad oxide layer. The pad oxide is a buffer which reduces stresses resulting from crystal mismatch between the silicon nitride layer and the substrate. The forming of the silicon nitride layer may be accomplished by any suitable technique, such as by chemical vapor deposition. The etching of silicon nitride determines the horizontal distribution of silicon nitride thickness on the top surface and the silicon nitride thickness controls the depth of oxygen implantation. Thus, selective etching of the silicon nitride layer enables a BOX of varying depth to be formed. The oxygen implantation is generally performed at high energy density such as at $10^{18}/cm^2$ at 200 keV as disclosed in U.S. Pat. No. 5,364,800 (Joyner, Jun. 24, 1993, page 1, lines 40–42). The annealing is typically performed at high temperature (e.g., 1300° F. for 6 hours as disclosed in U.S. Pat. No. 5,364,800, page 1, lines 43–46) to cause $SiO_2$ formation and repair crystal damage. Another method of forming a BOX of varying depth comprises directing an oxygen ion beam through a silicon dioxide screen of varying thickness and then into the depth of the substrate (see U.S. Pat. No. 5,364,800).

A trench is a vertical cavity from the top surface into the depth of the substrate, wherein electrically insulative material is placed within the cavity. A trench may be formed by techniques known by those skilled in the art. U.S. Pat. No. 5,536,675 (Bohr, Aug. 7, 1995) discloses such a technique comprising: growing a pad oxide ($SiO_2$) layer on the top surface of the substrate, depositing of a layer of silicon nitride ($Si_3N_4$) over the pad oxide, patterning the top surface with photoresist, exposing the top surface to ultraviolet radiation, etching through the unexposed silicon nitride and continuing to etch through the pad oxide and the underneath substrate to a desired depth to form the trench, optionally growing an oxide lining on the interior surfaces of the trench to passify the interior surfaces which may have been damaged during etching of the substrate, inserting insulative material into the trench to above the top surface, and optionally polishing to remove insulative material from above the top surface. The etching of the substrate may be accomplished by using a plasma comprising HBr and $NF_3$, or any other suitable etching chemical material such as $SiF_4$. The etching may be performed isotropically or anisotropically for generating vertical and/or sloped sidewalls. Any suitable insulative material, such as silicon dioxide, silicon nitride, or spin-on glass, may be used. The insulative material is distributed within the trench so as to provide electrical insulation between semiconductor regions respectively bordering the two sides of the trench that project into the substrate from the top surface.

U.S. Pat. No. 5,536,675 also discloses how the preceding process may be modified to form a T-shaped trench comprising two contiguous segments, wherein the top segment is wider than the bottom segment. Following formation of the first cavity as described above, the substrate is patterned with a photoresist and exposed to ultraviolet radiation so as to leave the bottom of the first cavity unprotected from subsequent etching. Then a second cavity segment is formed by etching deeper into the substrate from the bottom of the first cavity. U.S. Pat. No. 5,536,675 also discloses how the preceding processes may be modified to generate a shallow trench and a T-shaped deep trench having a narrow cavity segment underneath a wider upper segment, wherein the shallow trench and the wider upper segment of the T-shaped trench may be etched concurrently by covering the substrate with a suitable photoresist pattern prior to etching. A variety of methods of using photoresist patterning, exposure, and etching may be exploited to form a plurality of trenches concurrently. For example, a first cavity in a first location may be formed in isolation, followed by photoresist patterning, exposure, and etching so as to form a T-shaped trench in the first location while simultaneously forming an unsegmented trench in a second location.

The prior art does not disclose semiconductor structures having isolation characteristics that permit particular combinations of semiconductor devices, such as a fully depleted and partially depleted field effect transistors (FETs), to be formed on the same substrate.

All heretofore mentioned prior art is hereby incorporated by reference.

SUMMARY OF THE INVENTION

The present invention provides semiconductor structures, and associated methods of fabrication, having isolation characteristics that permit particular combinations of semiconductor devices, such as a fully depleted and partially depleted FETs, to be formed on the same substrate. A semiconductor structure of the present invention comprises: a substrate having a top surface, a continuous BOX of semiconductor oxide, and a plurality of trenches embedded within the substrate. The depth of the BOX may vary spatially in any manner that maintains the continuity of the BOX. Each trench comprises a point on the top surface and extends into the substrate as a vertical array of one or more contiguous segments. Each trench comprises electrically insulative matter so as to facilitate electrical separation between devices.

An embodiment of the present invention consists of a semiconductor structure comprising: a substrate having a top surface, a continuous depth-varying BOX, a first trench, and a second trench, wherein both the first trench and the second trench are positioned between the top surface and the BOX. The first trench and the second trench may each penetrate the substrate to the same depth or to different depths. The first trench and the second trench may each touch or not touch the BOX. The first trench and the second trench may each have one segment or a plurality of segments. Regions within the substrate which are electrically separated by the insulative barrier of the first trench, or of the second trench, may comprise a semiconductor device.

Another embodiment of the present invention provides a semiconductor structure, and associated methods of fabrication, comprising a substrate having a top surface, a continuous depth-varying BOX, a first trench positioned between the top surface and the BOX, and an external trench. The external trench is external to a first region between the BOX and the first surface. The external trench borders a side of the first region and touches an end surface of the BOX such that the external trench electrically isolates the first region from a second region within the substrate.

The present invention additionally provides a semiconductor structure comprising:

a substrate having a first surface;
a continuous buried oxide layer within the substrate, wherein a first portion of the buried oxide layer is disposed at a first depth relative to a point on the first surface, and wherein a second portion of the buried oxide layer is disposed at a second depth relative to the point on the first surface;
a first semiconductor region between the first surface and the first depth of the buried oxide layer, wherein the first semiconductor region touches the first surface and touches the buried oxide layer at the first depth;
a second semiconductor region between the first surface and the second depth of the buried oxide layer, wherein the second semiconductor region touches the first surface and does not touch the buried oxide layer;
a gate structure on the top surface, laterally between the first semiconductor region and the second semiconductor region; and
a third semiconductor region between the first surface and the buried oxide layer, wherein the third semiconductor region is continuously distributed between the first surface and the buried oxide layer, and wherein the third semiconductor region touches the buried oxide layer at the second depth, the first semiconductor region, the second semiconductor region, and the gate structure.

The BOX and the trenches for the semiconductor structures of the present invention may be formed by methods known to those skilled in the art as discussed previously. For each circuit, the BOX is formed before the trenches are formed. Each trench of a plurality of trenches may be formed in any order and portions of two or more trenches may be formed simultaneously by suitable photoresist patterning, exposure, and etching.

It is an object of the present invention to provide silicon-on-insulator (SOI) devices with both fully depleted and partially depleted elements on a common substrate.

It is an object of the present invention to provide SOI circuit elements for both digital and analog application on a common wafer.

It is an object of the present invention to provide SOI circuit elements for usage as electrostatic discharge (ESD) protection networks.

It is an object of the present invention to provide an improved resistor element in SOI technology.

It is an object of the present invention to an asymmetric structure to exist with a dual-step BOX.

It is an object of the present invention to allow low and high junction capacitance regions to exist with a dual-depth BOX.

It is an object of the present invention to allow an asymmetric gated lateral diode structure to exist with a dual-depth BOX.

It is an object of the present invention to permit a gated lateral diode and a vertical diode to coexist with a dual-depth BOX.

By having a BOX exist at different substrate depths and utilizing trenches having different depths of penetration, the present invention offers the following advantages. Combinations of many different semiconductor devices may coexist on the same substrate, including combinations of FETs, bipolar transistors, decoupling capacitors, diodes, gated diodes, resistors, and bulk semiconductor devices. Deep devices and shallow devices may coexist on the same substrate. Fully depleted and partially depleted FETs may coexist on the same substrate. Low capacitance MOFSETs and high capacitance MOFSETs may coexist on the same substrate. MOFSETS with low and high body electrical resistance may coexist on the same substrate. Bipolar devices and CMOS devices may coexist on the same substrate. A low-resistance shunt may be placed, without depth limitation, between an N-well resistor and the BOX while being electrically separated by a trench from another device located at a more shallow depth. Increased flexibility is afforded for dissipating heat from devices that protect chip circuits from electrostatic discharge (ESD), because a narrow space between a trench and the BOX provides a relatively low thermal resistance path for dissipating heat.

DETAILED DESCRIPTION OF THE INVENTION

Figure 1:
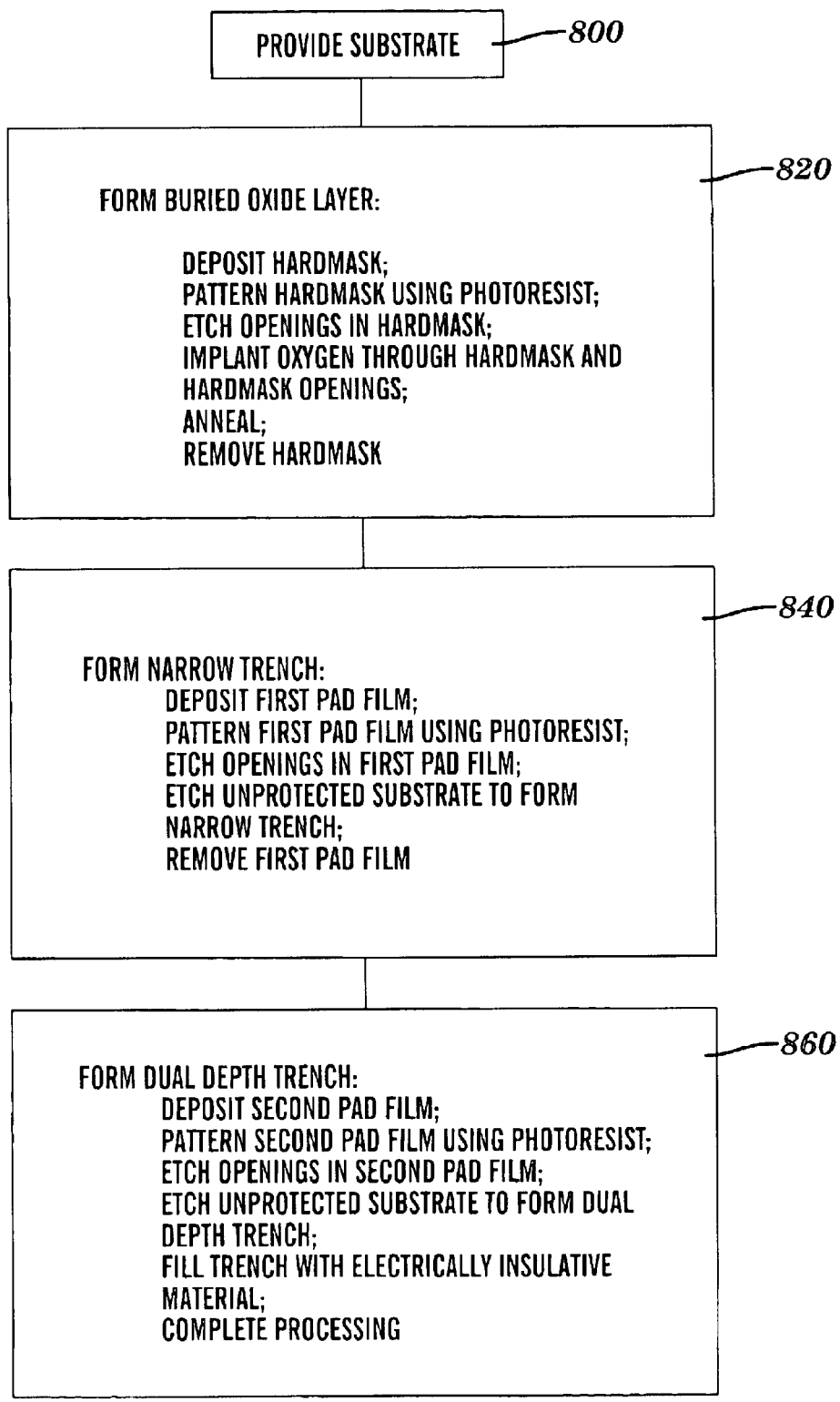
FIG. 1 depicts, in the form of a flow diagram, a method of forming a structure comprising a depth-varying BOX and a dual depth trench, in accordance with the present invention.

FIG. 1 illustrates, in the form of a flow diagram, a method of the present invention of forming a structure comprising a depth-varying BOX and dual depth trench. The process begins with step 800, which provides a substrate that typically comprises silicon. There are three remaining steps: step 820 for forming a buried oxide layer, step 840 for forming a narrow trench, and step 860 for forming the dual depth trench.

The step 820 for forming a buried oxide layer begins with depositing a hardmask on the substrate. The hardmask may comprise a layer of etchable material such as silicon nitride ($Si_3N_4$). An alternative hardmask comprises a pad oxide (e.g., $SiO_2$) layer on the surface of the substrate and a layer of silicon nitride deposited on the pad oxide layer. After the hardmask is deposited on the substrate, a layer of photoresist is deposited on the hardmask and then patterned for protecting selected areas of the hardmask. After exposing the photoresist to radiation (typically ultraviolet radiation), openings are etched in the unprotected portions of the hardmask through the hardmask to the surface of the substrate. Next, oxygen ions are implanted through both the hardmask and the hardmask openings, followed by annealing to form a BOX layer, typically comprising $SiO_2$. The BOX layer comprises a shallow BOX layer and a deep BOX layer. The shallow BOX layer is under the protected hardmask areas. The deep BOX layer is under the openings etched into the hardmask. After the BOX is formed, the hardmask is removed.

The next step 840 for forming a narrow trench starts with depositing an etchable first pad film, such as by forming a pad oxide layer on the substrate surface, followed by depositing a silicon nitride layer on the pad oxide layer. After the first pad film is deposited on the substrate, a layer of photoresist is formed on the first pad film and then patterned for protecting selected areas of the first pad film. After exposing the photoresist to radiation (typically ultraviolet radiation), openings are etched in the unprotected portions of the first pad film through the first pad film to the surface of the substrate. The etching is continued into the unprotected substrate, thereby forming a trench in the substrate. The trench thus formed is a "narrow" trench in contrast with the wider trench, or wider trench step of a dual depth trench, formed in the subsequent step 860 (to be described below). The narrow trench thus formed will be transferred into the deep portion of the dual depth trench formed in step 860. After the narrow trench is formed, the first pad film is removed.

The step 860 for forming a dual depth trench starts with depositing an etchable second pad film, such as by forming a pad oxide layer on the substrate surface and on the exposed surfaced of the narrow trench, followed by depositing a silicon nitride layer on the pad oxide layer. After the second pad film is deposited, a layer of photoresist is formed on the second pad film and then patterned for protecting selected areas. Unprotected areas include the narrow trench and areas on the substrate surface bordering the narrow tench. After exposing the photoresist to radiation (typically ultraviolet radiation), openings are etched in the unprotected portions of the second pad film through the second pad film to substrate material. The etching is continued into the unprotected substrate to form new openings in the substrate. The new opening beginning at the top substrate surface forms the shallow portion of the dual depth trench. The new opening beginning at the bottom of the narrow trench drives the narrow trench deeper into the substrate to form the deep portion of the dual depth trench. Next the dual depth trench is filled with electrically insulative material. The process is completed by such operations as polishing to remove filler material above the substrate surface.

FIGS. 2–15 illustrate various semiconductor structures of the present invention. In these structures, a trench will sometimes be described as touching a BOX. Such touching is intended to mean any form of physical touching including contacting at a point, abutting (contacting along a line or along a surface element), and penetrating such that the trench occupies volumetric space within the interior of the BOX. A trench described as not touching a BOX is understood to be separated from the BOX by substrate material typically comprising silicon. Similarly, a BOX described as touching the top surface of a substrate is considered to physically contact the top surface at a point, or abut the top surface along a line or surface element of the top surface.

Figure 2:
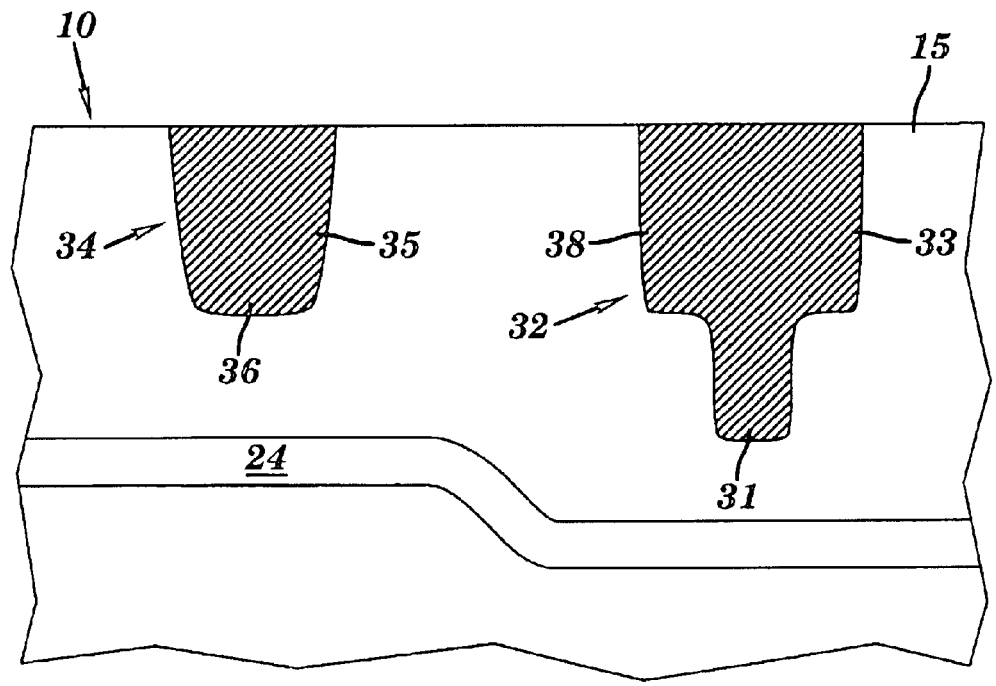
FIG. 2 depicts a cross-sectional view of a semiconductor structure showing a trench configuration with no trench touching a BOX, in accordance with the present invention.

FIG. 2 illustrates a simplified cross-sectional view of a semiconductor structure of the present invention, comprising a semiconductor substrate 10. The substrate 10 comprises a top surface 15, a continuous depth-varying BOX 24, a first trench 32, and a second trench 34. Both the first trench 32 and the second trench 34 are positioned between the top surface 15 and the BOX 24. Although the BOX 24 is shown as comprising two parallel segments at different depths, the depth of BOX 24 may vary spatially in any manner such that the BOX 24 is continuous. The BOX thicknesses and BOX depths at which the BOX 24 exists may be any BOX thicknesses and BOX depths, respectively, that can be attained by those skilled in the art, using known methods of forming a BOX such as the methods described herein. The distance between the substrate 10 and the BOX 24 typically varies between 0 μm and 10 μm. The BOX thickness is typically between 1500 Å and 2500 Å. A BOX disposed at two or more depths has a depth closest to the top surface 15 typically between 0.2 $\mu$m and 0.5 $\mu$m from the top surface, and a depth furthest from the top surface 15 typically between 1.0 $\mu$m and 2.0 $\mu$m. Although the BOX 24 is shown as not touching the top surface 15, the BOX 24 may touch the top surface 15.

The first trench 32 and the second trench 34 may penetrate the substrate 10 to the same depth or to different depths. Although the first trench 32 is shown as a two-segmented array and the second trench 34 is shown as a single segment, trench 32 and trench 34 may each generally comprise one segment or a plurality of contiguous segments. The widths and depths of trench segments may be any trench widths and depths, respectively, that can be attained by those skilled in the art, using known methods of forming a trench such as the methods described herein. For example, a single-segment trench from the top surface 15 penetrates the substrate 10 to a depth typically between 0.20 $\mu$m and 0.35 $\mu$m, and has a typical minimum width between 0.30 $\mu$m and 0.40 $\mu$m. A two-segment trench has a segment closest to the top surface 15 with a typical penetration depth between 0.20 $\mu$m and 0.35 $\mu$m and a typical minimum width between 0.60 $\mu$m and 0.80 $\mu$m, and a segment furthest from the top surface 15 with a typical penetration depth between 0.50 $\mu$m and 1.0 $\mu$m and a typical width between 0.15 $\mu$m and 0.30 $\mu$m. A sidewall of a segment may be either perpendicular to the top surface 15, as shown in FIG. 2 (see e.g., sidewall 38 of the first trench 32), or oriented at an arbitrary angle with respect to the top surface 15. The bottom surface 31 of the first trench 32, and the bottom surface 36 of the second trench 34, may each be parallel to the top surface 15, as shown in FIG. 2, or at an arbitrary angle with respect to the top surface 15. The first trench 32 contains insulative material 33 so as to facilitate electrical separation between devices located to the left and right of the first trench 32 (see e.g., trench 154 in FIG. 7). Similarly, the second trench 34 contains insulative material 35 so as to facilitate electrical separation between devices located to the left and right of the second trench 34. Neither the first trench 32 nor the second trench 34 touch the BOX 24. The BOX and trench depths and dimensions in FIGS. 3–12 are as discussed above for the BOX and trenches of FIG. 2.

Figure 3:
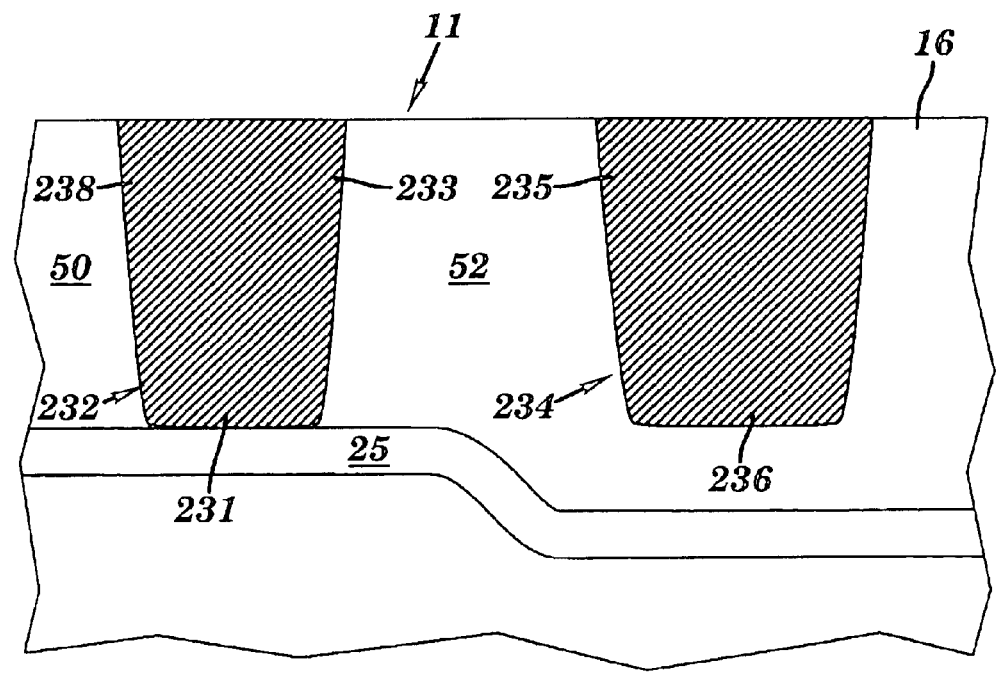
FIG. 3 depicts a cross-sectional view of a semiconductor structure showing a trench configuration with one trench touching a BOX, in accordance with the present invention.

FIG. 3 illustrates a simplified cross-sectional view of a semiconductor structure of the present invention, comprising a semiconductor substrate 11. The substrate 11 comprises a top surface 16, a continuous depth-varying BOX 25, a third trench 232, and a fourth trench 234. Both the third trench 232 and the fourth trench 234 are positioned between the top surface 16 and the BOX 25. Although the BOX 25 is shown as comprising two parallel segments at different depths, the depth of BOX 25 may vary spatially in any manner such that the BOX 25 is continuous. Although the BOX 25 is shown as not touching the top surface 16, the BOX 25 may touch the top surface 16. The third trench 232 and the fourth trench 234 may penetrate the substrate 11 to the same depth or to different depths. Although the third trench 232 is shown as single segment and the fourth trench 234 is shown as a single segment, each of trenches 232 and 234 generally comprise one segment or a plurality of contiguous segments. A sidewall of a segment may be either perpendicular to the top surface 16, as shown in, or oriented at an arbitrary angle with respect to the top surface 16 FIG. 3 (see e.g., sidewall 238 of third trench 232). The bottom surface 231 of the third trench 232, and the bottom surface 236 of the fourth trench 234, may each be parallel to the top surface 16, as shown in FIG. 3, or at an arbitrary angle with respect to the top surface 16. The third trench 232 touches the BOX 25 and the fourth trench 234 does not touch the BOX 25. The third trench 232 contains insulative material 233 so as to facilitate electrical separation between devices located to the left and right of third trench 232. In particular, the third trench 232 electrically separates region 50 from region 52, and regions 50 and 52 may each comprise a semiconductor device. The fourth trench 234 contains insulative material 235 so as to facilitate electrical separation between devices located to the left and right of fourth trench 234.

Figure 4:
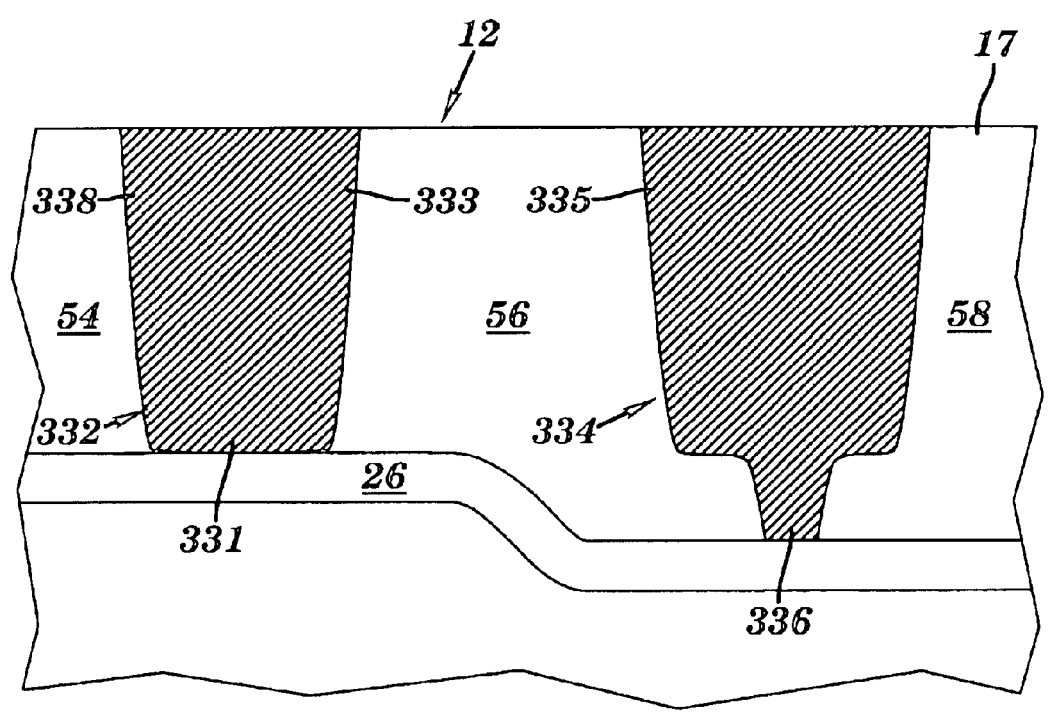
FIG. 4 depicts a cross-sectional view of a semiconductor structure showing a trench configuration with two trenches touching a BOX, in accordance with the present invention.

FIG. 4 illustrates a simplified cross-sectional view of a semiconductor structure of the present invention, comprising a semiconductor substrate 12. The substrate 12 comprises a top surface 17, a continuous depth-varying BOX 26, a fifth trench 332, and a sixth trench 334. Both the fifth trench 332 and the sixth trench 334 are positioned between the top surface 17 and the BOX 26. Although the BOX 26 is shown as comprising two parallel segments at different depths, the depth of BOX 26 may vary spatially in any manner such that the BOX 26 is continuous. Although the BOX 26 is shown as being separated from the top surface 17, the BOX 26 may touch the top surface 17. The fifth trench 332 and the sixth trench 334 may penetrate the substrate 12 to the same depth or to different depths. Although the fifth trench 332 is shown as a single segment and the sixth trench 334 shown as a two-segmented array, each of trenches 332 and 334 generally comprises one or a plurality of contiguous segments. A sidewall of a segment may be either perpendicular to the top surface 17, as shown in FIG. 4, or oriented at an arbitrary angle with respect to the top surface 17 (see e.g., sidewall 338 of fifth trench 332). The bottom surface 331 of the fifth trench 332, and the bottom surface 336 of the sixth trench 334, may each be parallel to the top surface 17, as shown in FIG. 4, or at an arbitrary angle with respect to the top surface 17. Both the fifth trench 332 and the sixth trench 334 touch the BOX 26. The fifth trench 332 contains insulative material 333 so as to facilitate electrical separation between devices located to the left and right of fifth trench 332. In particular, fifth trench 332 electrically separates region 54 from region 56, and regions 54 and 56 may each comprise a semiconductor device. The sixth trench 334 contains insulative material 335 so as to facilitate electrical separation between devices located to the left and right of sixth trench 334. In particular, sixth trench 334 electrically separates region 56 from region 58, and region 58 may comprise a semiconductor device.

Figure 5:
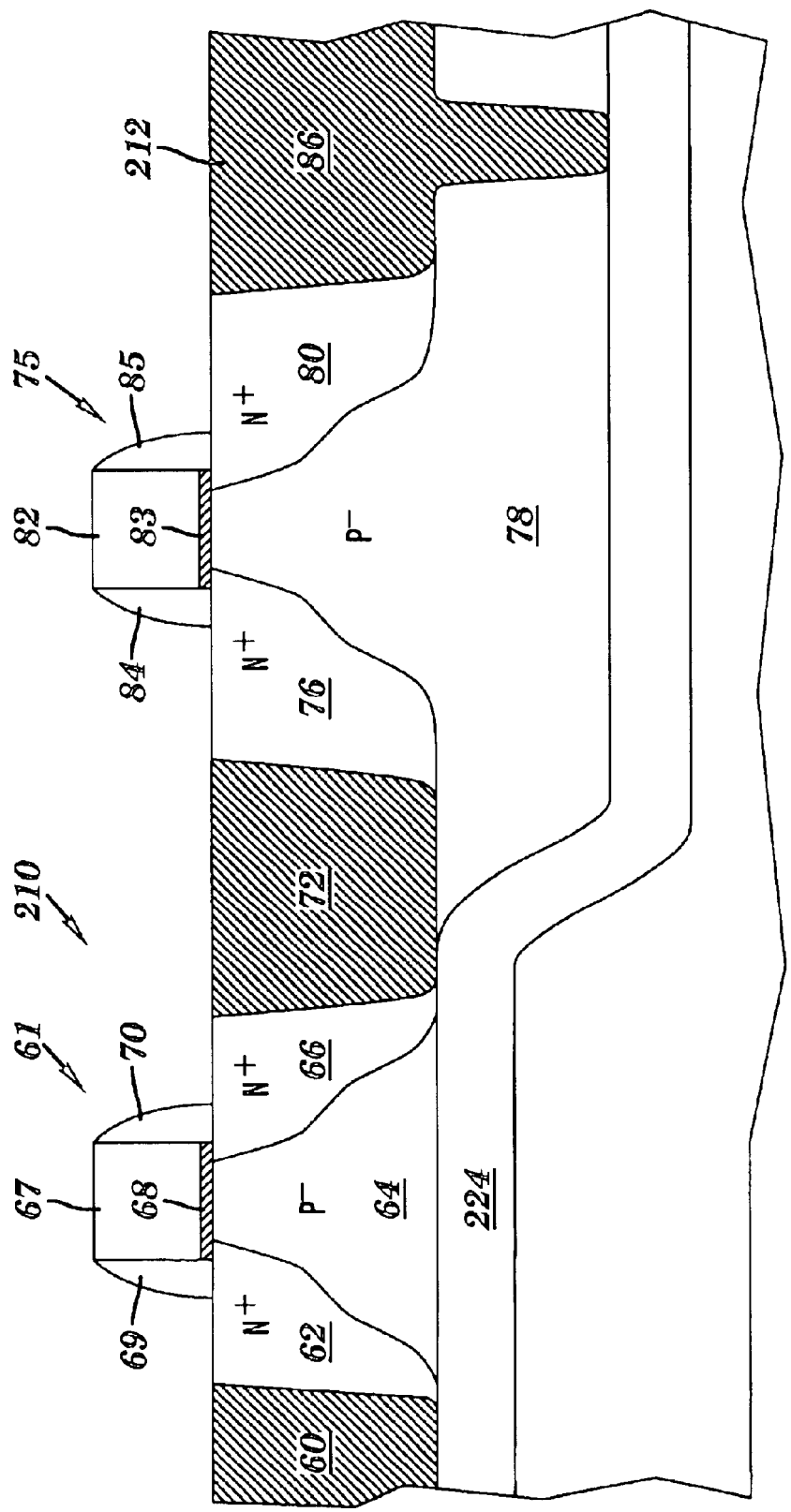
FIG. 5 depicts a cross-sectional view of a semiconductor structure showing a configuration containing a fully depleted FET and a partially depleted FET, in accordance with the present invention.

FIGS. 5–12 illustrate various arrangements of trenches and semiconductor devices. FIG. 5 shows a simplified cross-sectional view of a semiconductor structure of the present invention. The substrate 210 comprises a top surface 212 and a fully depleted FET 61 which is electrically isolated by trench 60, trench 72, and BOX 224. The fully depleted FET 61 comprises N+ material 62, P− material 64, N+ material 66, gate 67, gate insulator 68, and insulating spacers 69 and 70. The N+ material 62 and N+ material 66 each have a doping concentration typically between $10^{19}/cm^3$ and $10^{21}/cm^3$. The P− material 64 has a doping concentration typically between $10^{16}/cm^3$ and $10^{18}/cm^3$. The gate 67 minimum width is typically between 0.15 $\mu$m and 0.25 $\mu$m. The gate insulator 68 has a width approximately equal to the width of the gate 67, and a thickness typically between 30 Å and 50 Å. The insulating spacers 69 and 70 have a maximum width typically between 300 Å and 1500 Å. The dimensions of the gate structure of FET 75 in FIG. 5, and of the gate structures depicted in FIGS. 6–12, are as discussed above for the gate structure of FET 61 in FIG. 5.

FIG. 5 also shows a partially depleted FET 75 which is electrically isolated by trench 72, trench 86, and BOX 224. The partially depleted FET 75 comprises N+ material 76, P– material 78, N+ material 80, gate 82, gate insulator 83, and insulating spacers 84 and 85. Thus, FIG. 5 illustrates a fully depleted FET 61 and a partially depleted FET 75 within the same substrate. The N+ material 76 and N+ material 80 each penetrate the substrate 210 to about the same depth, typically between 0.10 $\mu$m and 0.25 $\mu$m. The P– material 78 penetrates the substrate 210 to a depth typically between 0.50 $\mu$m and 1.0 $\mu$m. The N+ material 76 and N+ material 80 each have a doping concentration typically between $10^{19}$/cm$^3$ and $10^{21}$/cm$^3$. The P– material 78 has a doping concentration typically between $10^{16}$/cm$^3$ and $10^{18}$/cm$^3$. Noting that the FET 75 is an NFET, the FET 75 would be a PFET if N+ material 76, P– material 78, and N+ material 80 were respectively replaced by P+ material, N– material, and P+ material, which would illustrate a fully depleted NFET and a partially depleted PFET on the same substrate.

Figure 11:
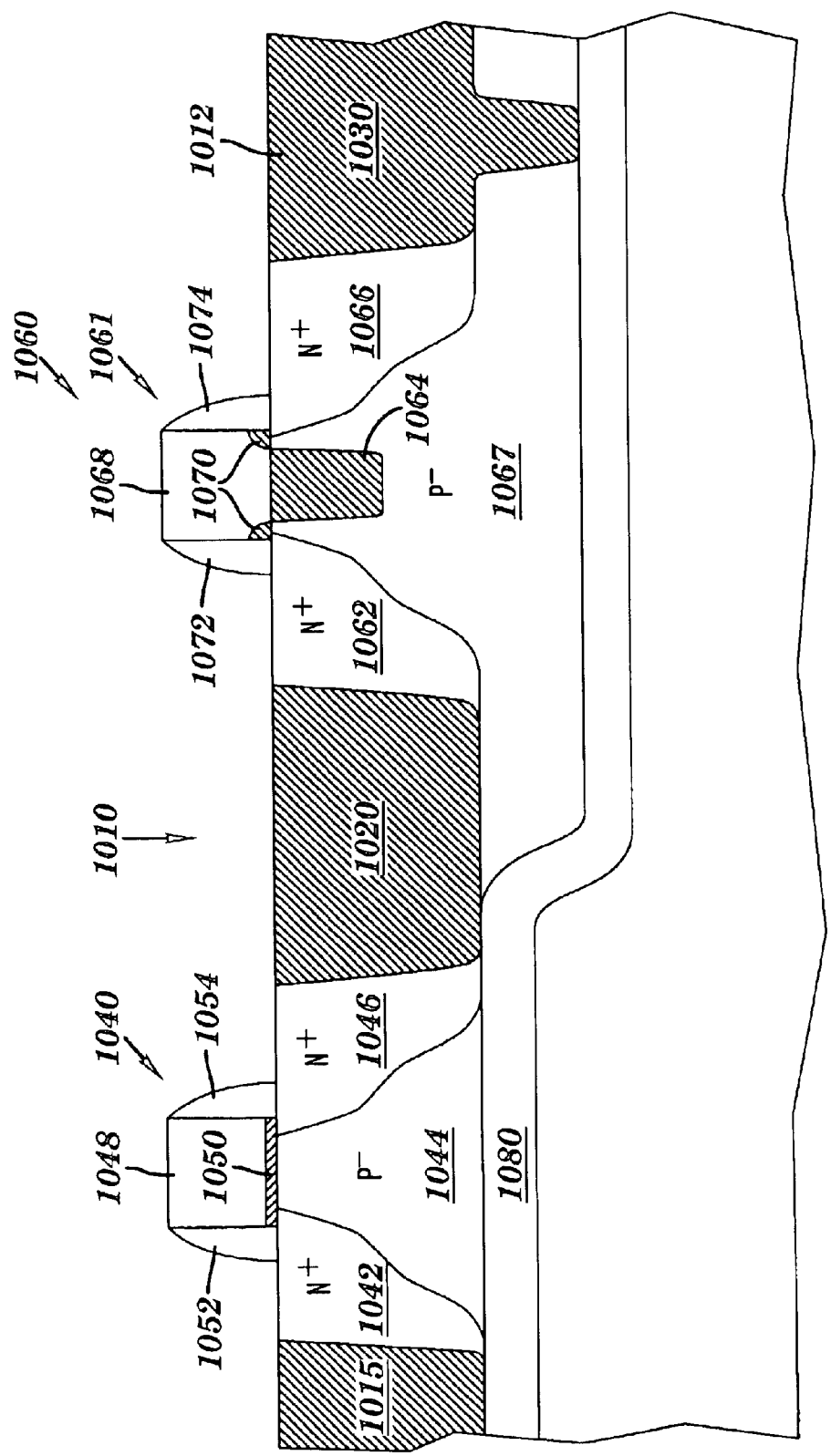
FIG. 11 depicts a cross-sectional view of a semiconductor structure showing a configuration containing an FET and a thick oxide device, in accordance with the present invention.

FIG. 11 shows a simplified cross-sectional view of a semiconductor structure of the present invention. The substrate 1010 comprises a top surface 1012 and an FET 1040 which is electrically isolated by trench 1015, trench 1020, and BOX 1080. The FET 1040 comprises N+ material 1042, P– material 1044, N+ material 1046, gate 1048, gate insulator 1050, and insulating spacers 1052 and 1054. The N+ material 1042, P– material 1044, and N+ material 1046, have geometrical characteristics and doping concentrations as respectively described for N+ material 62, P– material 64, and N+ material 66 of FET 61 in FIG. 5.

FIG. 11 also shows a thick oxide device 1060 is electrically isolated by trench 1020, trench 1030 and BOX 1080. The thick oxide device 1060 comprises N+ material 1062, P– material 1067, N+ material 1066, trench 1064 which electrically separates N+ material 1062 from N+ material 1066, and gate structure 1061. The gate structure 1061, which is optional and could be omitted, comprises gate 1068, gate insulator 1070, and insulating spacers 1072 and 1074. Trench 1064 has the role of an insulative extension of gate insulator 1070. Thus, FIG. 11 illustrates an FET 1040 and a thick oxide device 1060 within the same substrate. The N+ material 1062 and N+ material 1066 each penetrate the substrate 1010 to about the same depth, typically between 0.10 $\mu$m and 0.25 $\mu$m. The P– material 1067 encompasses an upper depth (defined by the penetration depth of trench 1064) typically between 0.15 $\mu$m and 0.35 $\mu$m, and a lower depth (defined by the depth of BOX 1067) typically between 1.0 $\mu$m and 2.0 $\mu$m. The N+ materials 1062 and 1066 are separated by a distance typically between 0.15 $\mu$m and 0.30 $\mu$m. The N+ material 1062 and N+ material 1066 each have a doping concentration typically between $10^{19}$/cm$^3$ and $10^{21}$/cm$^3$. The P– material 1067 has a doping concentration typically between $10^{16}$/cm$^3$ and $10^{18}$/cm$^3$. Noting that the FET 1040 is an NFET, the FET 1040 would be a PFET if N+ material 1042, P– material 1044, and N+ material 1046 were respectively replaced by P+ material, N– material, and P+ material, which would illustrate a PFET and a thick oxide device on the same substrate. The thick oxide device 1060 would function as an NPN bipolar transistor if the gate structure 1061 were not used and if a forward-biased voltage were applied between the base (P– material 1067) and the emitter (N+ material 1062 or N+ material 1066). The thick oxide device 1060 would function as an PNP bipolar transistor, upon application of forward biasing, if the N+ material 1062, P– material 1067, and N+ material 1066 were respectively replaced with P+ material, N– material, and P+ material. As stated previously, the gate structure 1061 is optional and may be omitted.

Figure 6:
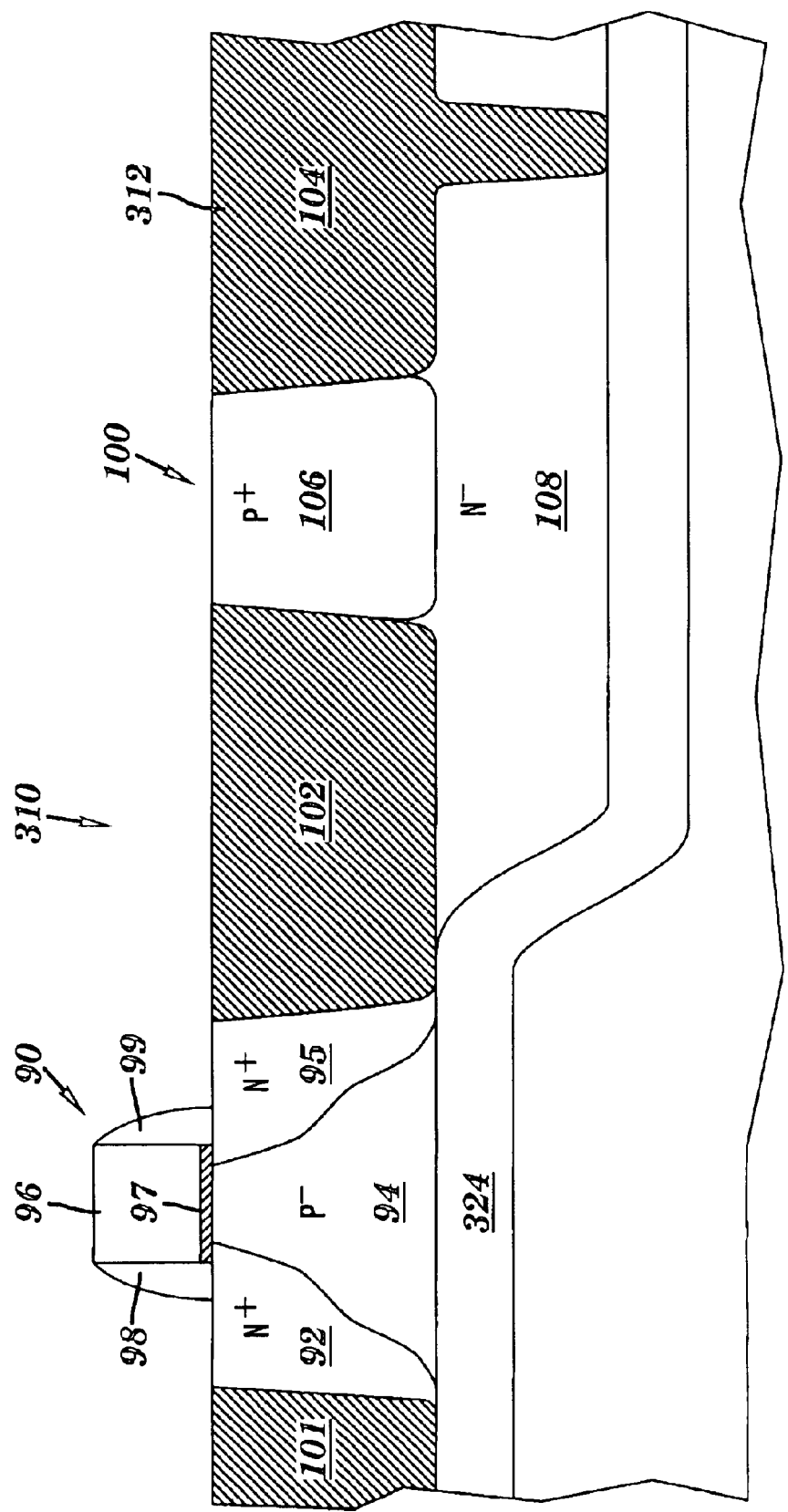
FIG. 6 depicts a cross-sectional view of a semiconductor structure showing a configuration containing an FET and a vertical diode, in accordance with the present invention.

FIG. 6 shows a simplified cross-sectional view of a semiconductor structure of the present invention. The substrate 310 comprises a top surface 312, an FET 90, and a vertical diode 100. The FET 90 is electrically isolated by trench 101, trench 102, and BOX 324. The vertical diode 100 is electrically isolated by trench 102, trench 104, and BOX 324. The FET 90 comprises N+ material 92, P– material 94, N+ material 95, gate 96, gate insulator 97, and insulating spacers 98 and 99. The N+ material 92, P– material 94, and N+ material 95, have geometrical characteristics and doping concentrations as respectively described for N+ material 62, P– material 64, and N+ material 66 of FET 61 in FIG. 5. Although FIG. 6 shows FET 90 as fully depleted, FET 90 could be partially depleted FET if the N+ material 92, P– material 94, and N+ material 95 were reconfigured geometrically to be similar to FET 75 in FIG. 5. Moreover, noting that the FET 90 is an N-type MOSFET, the FET 90 would become a P-type MOSFET if N+ material 92, P– material 94, and N+ material 95 were respectively replaced by P+ material, N– material, and P+ material.

The vertical diode 100 in FIG. 6 comprises P+ material 106 and N– material 108. The P+ material 106 has a penetration depth typically between 0.10 $\mu$m and 0.25 $\mu$m, and a doping concentration typically between $10^{18}$/cm$^3$ and $10^{21}$/cm$^3$. The N– material 108 has a doping concentration typically between $10^{16}$/cm$^3$ and $10^{18}$/cm$^3$. Alternatively, the diode 100 could be reconfigured as another vertical diode such that the P+ material 106 is replaced with N+ material and the N– material 108 is replaced with P– material.

Figure 7:
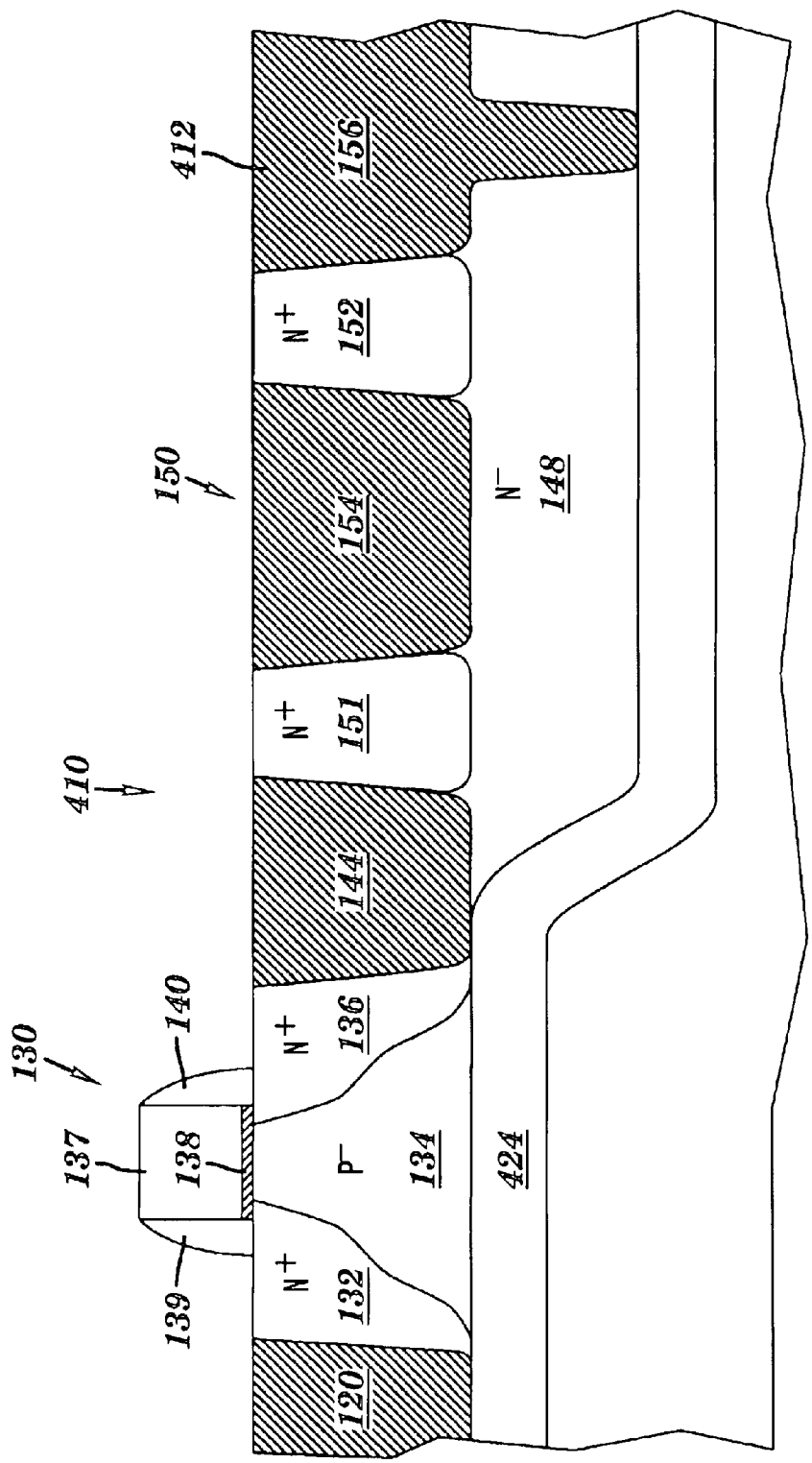
FIG. 7 depicts a cross-sectional view of a semiconductor structure showing a configuration containing an FET and a resistor, in accordance with the present invention.

FIG. 7 shows a simplified cross-sectional view of a semiconductor structure of the present invention. The substrate 410 comprises a top surface 412, an FET 130, and resistor structure 150. FET 130 is electrically isolated by trench 120, trench 144, and BOX 424. Resistor structure 150 is electrically isolated by trench 144, trench 156, and BOX 424. FET 130 comprises N+ material 132, P– material 134, N+ material 136, gate 137, gate insulator 138, and insulating spacers 139 and 140. The N+ material 132, P– material 134, and N+ material 136, have geometrical characteristics and doping concentrations as respectively described for N+ material 62, P– material 64, and N+ material 66 of FET 61 in FIG. 5. Noting that the FET 130 is an N-channel MOSFET, the FET 130 would become a P-channel MOSFET if N+ material 132, P– material 134, and N+ material 136 were respectively replaced by P+ material, N– material, and P+ material.

The resistor structure 150 in FIG. 7 comprises N– resistor 148, N+ electrical contacts 151 and 152 which couple the N– resistor 148 to external circuitry, and trench 154 which insulates electrical contacts 151 and 152 from each other. The N+ electrical contacts 151 and 152 each have penetration depths typically between 0.10 $\mu$m and 0.25 $\mu$m, and doping concentrations typically between $10^{19}$/cm3 and $10^{21}$/cm3. The N– resistor 148 extends into the substrate 410 to a depth (defined by the depth of BOX 424) typically between 1.0 $\mu$m and 2.0 $\mu$m, and has a doping concentration typically between $10^{16}$/cm3 and $10^{18}$/cm3.

Figure 8:
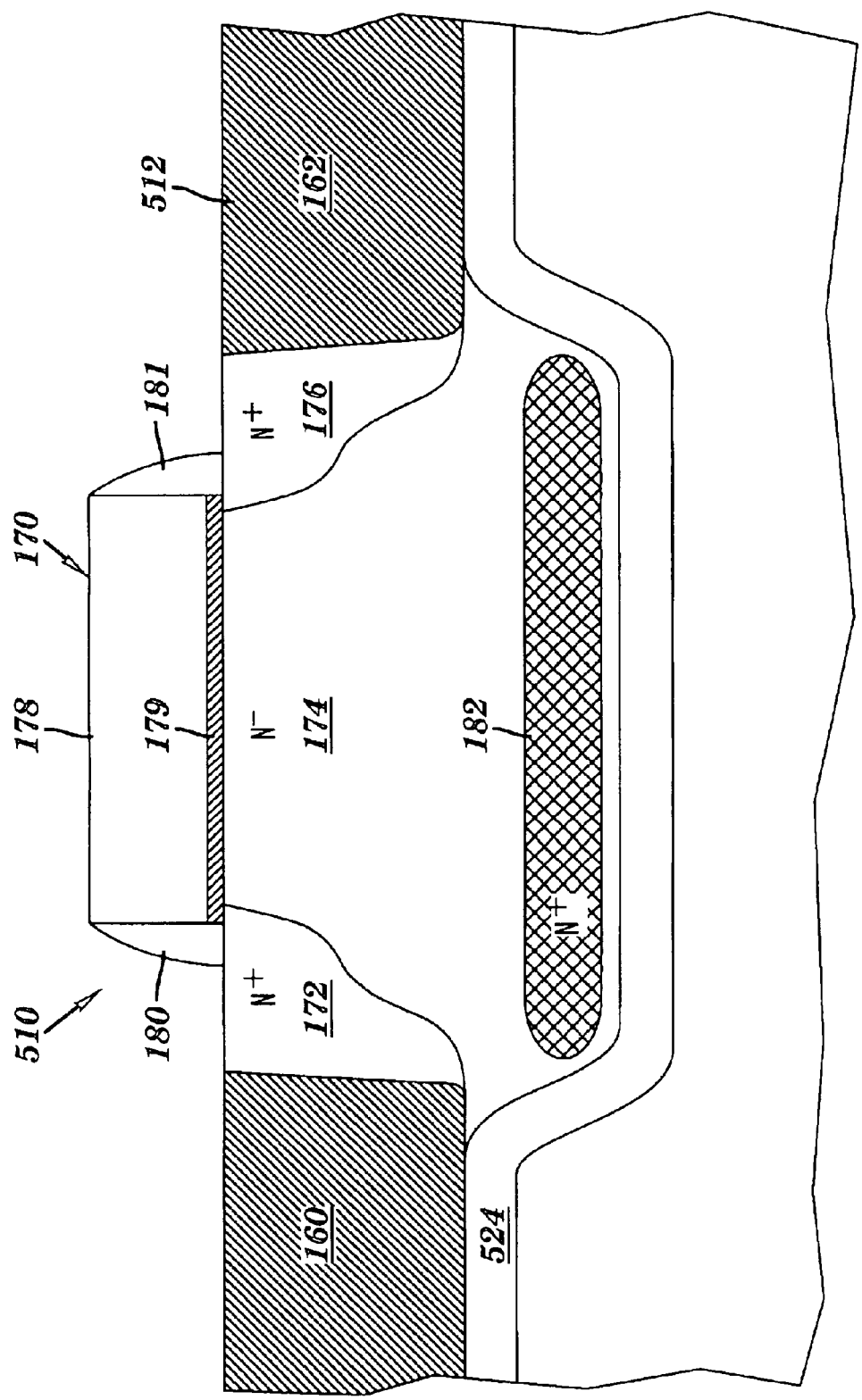
FIG. 8 depicts a cross-sectional view of a semiconductor structure showing a configuration containing a decoupling capacitor, in accordance with the present invention.

FIG. 8 depicts a simplified cross-sectional view of a semiconductor structure of the present invention. The substrate 510 comprises a top surface 512. FIG. 8 shows a decoupling capacitor 170, which is electrically isolated by trench 160, trench 162, and BOX 524. Decoupling capacitor 170 comprises: capacitor plate 178, N– material 174 which serves as the other capacitor plate, capacitor dielectric 179, insulating spacers 180 and 181, and electrical contacts 172 and 176 which comprise N+ material. The N– material 174 also serves as a resistor between electrical contacts 172 and 176, so that the decoupling capacitor 170 is effectively a resistor-capacitor configuration with an RC time constant, where R is resistance and C is capacitance. If there is a sudden drop in voltage, the capacitor 170 discharges its charge buildup through the resistor 174 so as to restore the voltage. The optional low-resistance shunt 182, comprising N+ material, reduces the resistance between electrical contacts 172 and 176 and the bottom of the capacitor dielectric 179, thereby reducing the RC time constant which hastens the response of the decoupling capacitor 170 to the sudden voltage drop. The electrical contacts 172 and 176 each extend into the substrate 510 to approximately the same depth, typically between 0.10 $\mu$m and 0.25 $\mu$m, and each has a doping concentration typically between $10^{19}$/cm3 and $10^{21}$/cm3. The N– material 174 has a doping concentration typically between $10^{16}$/cm3 and $10^{18}$/cm3. The optional low-resistance shunt 182 has a doping concentration typically between $10^{18}$/cm3 and $10^{19}$/cm3., and is at a depth typically between 0.5 $\mu$m and 1.5 $\mu$m. In FIG. 8, the semiconductor structure would represent a gated diode if the N+ material of electrical contact 176 were replaced with P+ material, wherein the electrical contact 176 would become the anode 176 of the gated diode, the N– resistor 174 and electrical contact 172 would collectively become the cathode of the gated diode with cathode component 174 comprising N– material and cathode component 172 comprising N+ material. Additionally, the capacitor plate 178 would become the gate 178 of the gated diode, the capacitor dielectric 179 would become the gate dielectric 179 of the gated diode, and insulating spacers 180 and 181 would continue to have the role of insulating spacers as part of the gated diode.

Figure 12:
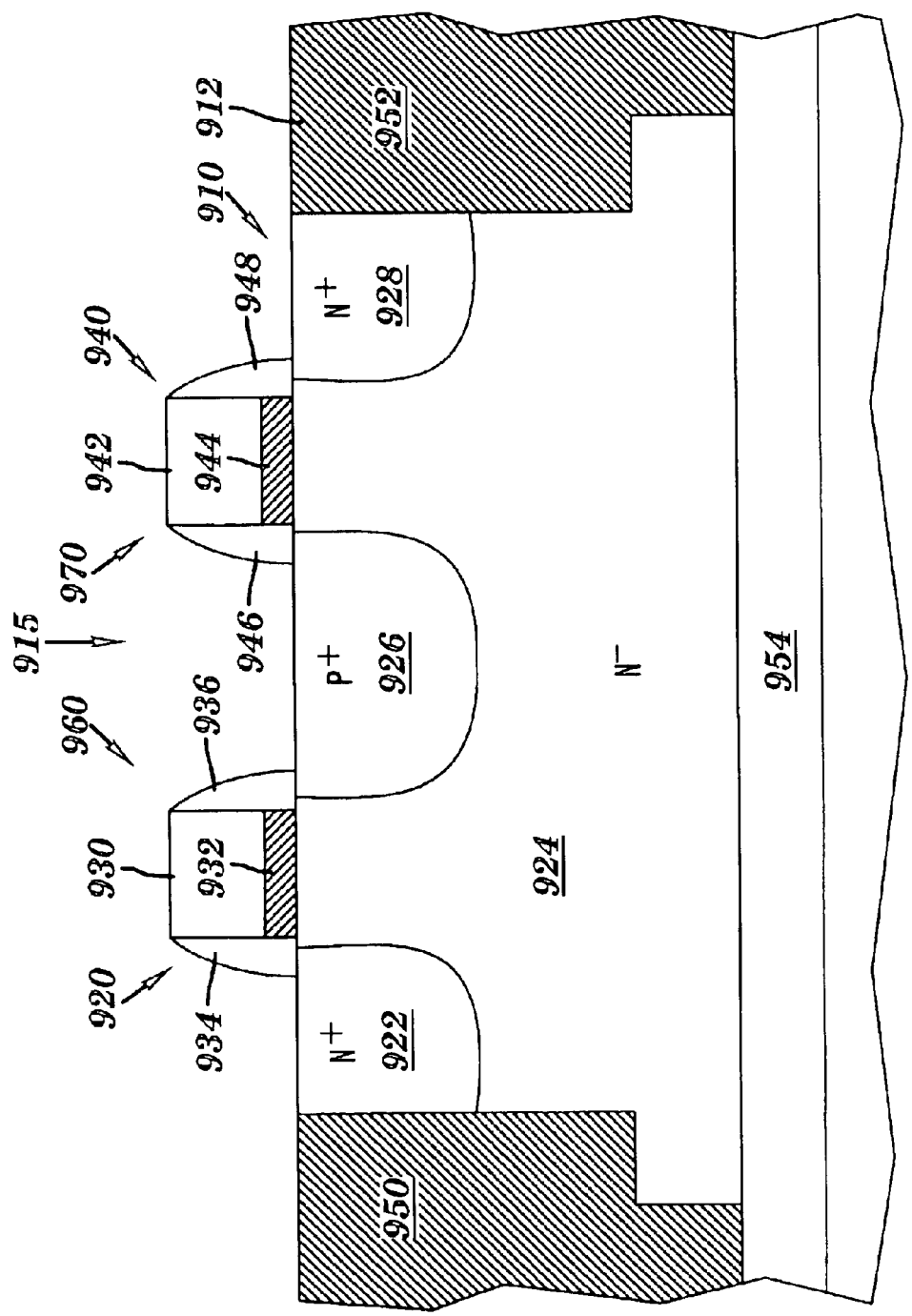
FIG. 12 depicts a cross-sectional view of a semiconductor structure showing a configuration containing a polysilicon bounded diode, in accordance with the present invention.

FIG. 12 depicts a simplified cross-sectional view of a semiconductor structure of the present invention. The substrate 910 comprises a top surface 912. FIG. 12 shows a polysilicon bounded diode structure 915, which is electrically isolated by trench 950, trench 952, and BOX 954. FIG. 12 shows the polysilicon bounded diode structure 915 as comprising a first gated diode 960 and a second gated diode 970. The first gated diode 960 includes: the anode comprising P+ material 926, the cathode comprising N– material 924 and N+ material 922, and gate structure 920. The gate structure 920 includes gate 930, gate insulator 932, insulating spacers 934 and 936. The second gated diode 970 includes: the anode comprising P+ material 926, the cathode comprising N– material 924 and N+ material 928, and gate structure 940. The gate structure 940 includes gate 942, gate insulator 944, insulating spacers 946 and 948. N– material 924 provides a common cathode for the first gated diode 960 and the second gated diode 970. The N+ material 922 and N+ material 928 each extend into the substrate 910 to a depth typically between 0.1 $\mu$m and 0.25 $\mu$m, and each has a doping concentration typically between $10^{19}$/cm$^3$ and $10^{21}$/cm$^3$. The P+ material 926 extends into the substrate 910 to a depth typically between 0.10 $\mu$m and 0.25 $\mu$m, and has a doping concentration typically between $10^{19}$/cm$^3$ and $10^{21}$/cm$^3$. The common cathode material 924 touches BOX 954 at a depth typically between 1.0 $\mu$m and 2.0 $\mu$m, and has a doping concentration typically between $10^{16}$/cm$^3$ and $10^{18}$/cm$^3$. A polysilicon bounded diode structure of opposite polarity would result if N+ material 922, P+ material 926, N– material 924, and N+ material 928 were respectively replaced with P+ material, N+ material, P– material, and P+ material. Although FIG. 12 illustrates two gated diodes, any number of gated diodes may appear within the polysilicon bounded diode structure 915, wherein a deep cathode region (e.g., N– material 924) provides common cathode material for each gated diode and is insulatively bounded by a BOX (e.g., BOX 954), wherein each gated diode (e.g., first gated diode 960) comprises an anode of first conductivity (e.g., P+ material 926) and is electrically isolated by at least one gate structure (e.g., gate structure 920), and wherein each gated diode (e.g., first gated diode 960) comprises a cathode of second conductivity (e.g., N+ material 922) and is electrically insulated by at least one gate structure (e.g., gate structure 920) and by at least one trench (e.g., trench 950).

Figure 9:
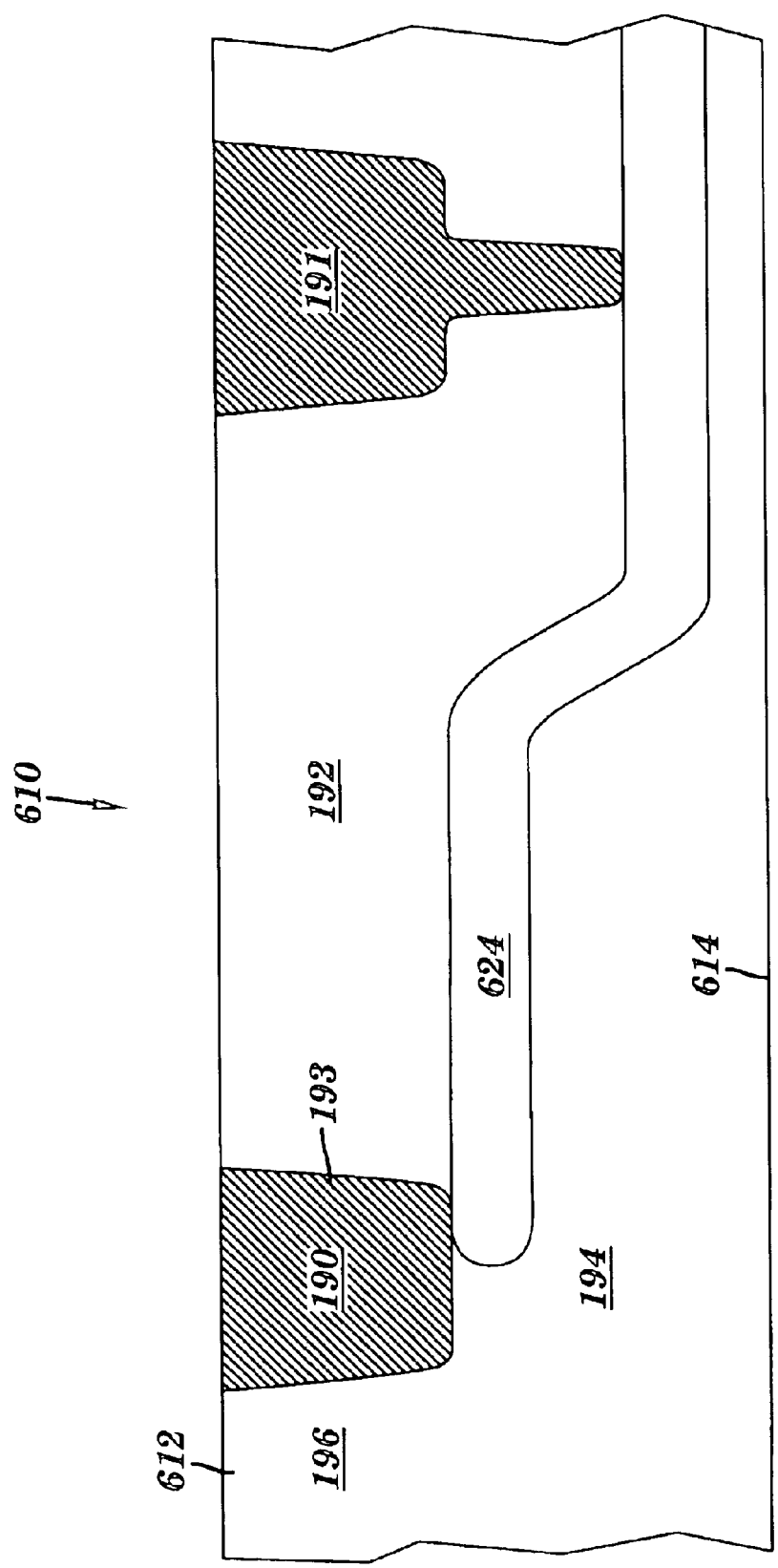
FIG. 9 depicts a cross-sectional view of a semiconductor structure showing an external trench that borders the space between a BOX and the top surface of a substrate, in accordance with the present invention.

FIG. 9 depicts a simplified cross-sectional view of a semiconductor structure of the present invention, comprising a semiconductor substrate 610 having a top surface 612. The substrate 610 comprises a BOX 624 with a trench 191 between the BOX 624 and the top surface 612, along with an external trench 190 that is external to region 192, wherein region 192 comprises a space between the BOX 624 and the top surface 612. The external trench 190 borders a side 193 of the region 192 and the external trench 190 touches the BOX 624. There is no BOX in a space 194 between the external trench 190 and a bottom surface 614 of the substrate 610. The external trench 190 is so insulated as to provide electrical separation between the region 192 and another region 196 of the substrate, wherein the other region 196 includes the space 194 and is external to the region 192. The trench 191 and the external trench 190 may each have any of the characteristics generally available to the first trench 32 in FIG. 2. The BOX 624 may have any of the characteristics generally available to the BOX 24 in FIG. 2. Other region 196 may comprise a bulk semiconductor device such as the FET 730 illustrated in FIG. 10.

Figure 10:
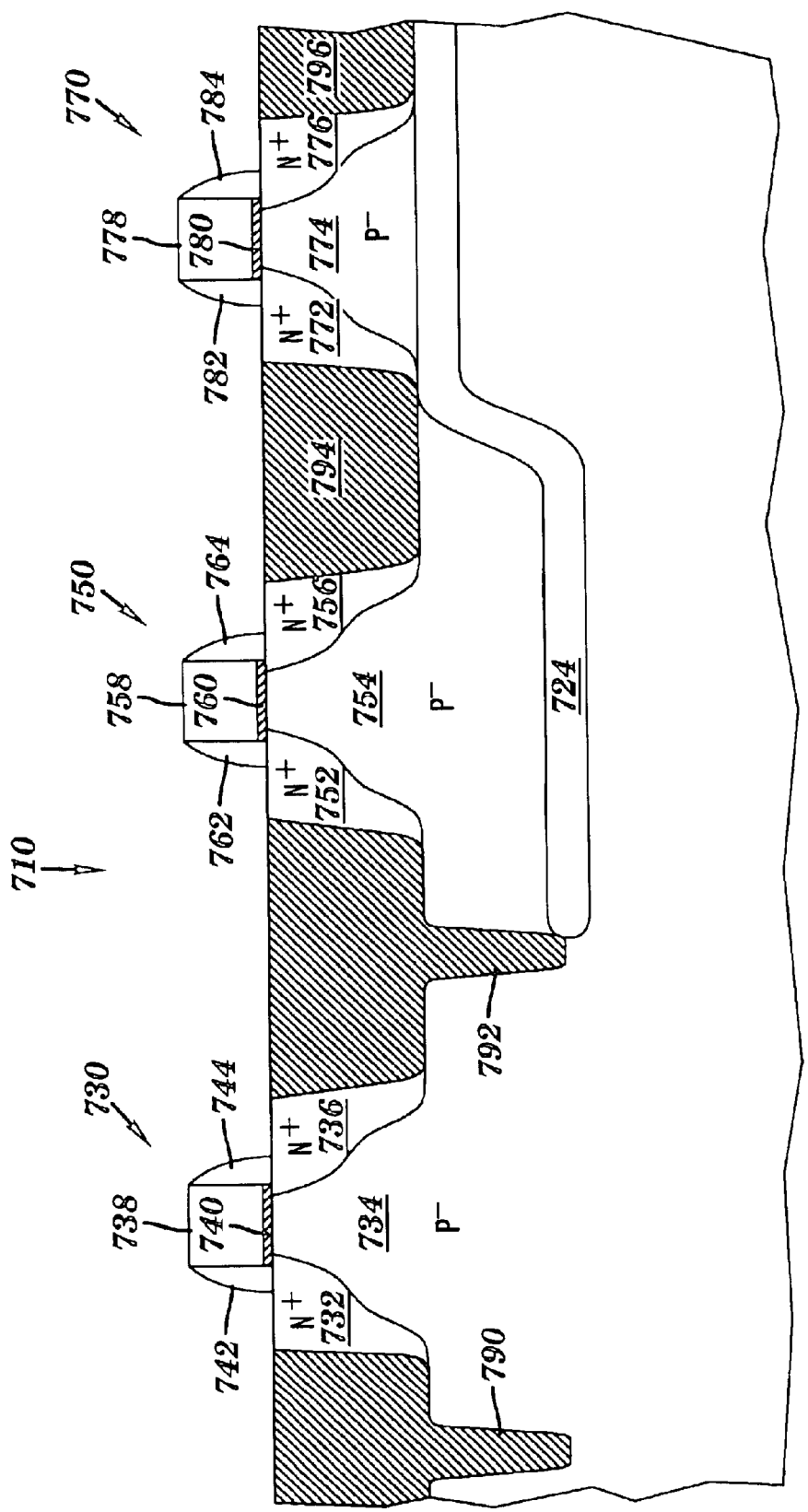
FIG. 10 depicts a cross-sectional view of a semiconductor structure showing an FET as a bulk device along with trenches and a depth-varying BOX, in accordance with the present invention.

FIG. 10 shows a simplified cross-sectional view of a semiconductor structure of the present invention. The substrate 710 comprises a top surface 712, an FET 730, an FET 750, and an FET 770. FET 750 is electrically isolated by trench 792, trench 794, and BOX 724. FET 770 is electrically isolated by trench 794, trench 796, and BOX 724. FET 730 is a bulk semiconductor device with no BOX below FET 730. FET 730 is electrically isolated by trench 790, trench 792, and BOX 724. FET 730 comprises N+ material 732, P– material 734, N+ material 736, gate 738, gate insulator 740, and insulating spacers 742 and 744. FET 750 comprises N+ material 752, P– material 754, N+ material 756, gate 758, gate insulator 760, and insulating spacers 762 and 764. FET 770 comprises N+ material 772, P– material 774, N+ material 776, gate 778, gate insulator 780, and insulating spacers 782 and 784. The geometrical and doping characteristics of FET 770 are as given for FET 61 in FIG. 5. The geometrical and doping characteristics of FET 710 are as given for FET 75 in FIG. 5. For FET 730, the N+ material 732 and N+ material 736 each extend to a depth typically between 0.10 $\mu$m and 0.25 $\mu$m, and have doping concentrations typically between $10^{19}$/cm$^3$ and $10^{21}$/cm$^3$. The P– material 774 has a doping concentration typically between $10^{16}$/cm$^3$ and $10^{18}$/cm$^3$. Noting that the FET 730 is an NFET, the FET 730 would become a PFET if N+ material 732, P– material 734, and N+ material 736 were respectively replaced by P+ material, N– material, and P+ material. Noting that the FET 750 is an NFET, the FET 750 would become a PFET if N+ material 752, P– material 754, and N+ material 756 were respectively replaced by P+ material, N– material, and P+ material. Noting that the FET 770 is an NFET, the FET 770 would become a PFET if N+ material 772, P– material 774, and N+ material 776 were respectively replaced by P+ material, N– material, and P+ material.

The preceding FIGS. 2–12 exemplify the many varieties of possible semiconductor structure configurations within the scope of the present invention. Each semiconductor structure of the present invention comprises a substrate having a BOX, at least two trenches, and semiconductor devices. The BOX and the trenches for the semiconductor structures of the present invention may be formed by methods discussed herein. For each semiconductor structure, the BOX is formed before the trenches are formed. Each trench of a plurality of trenches may be formed in any order and portions of two or more trenches may be formed simultaneously by suitable photoresist patterning, exposure, and etching, as discussed herein.

Figure 13:
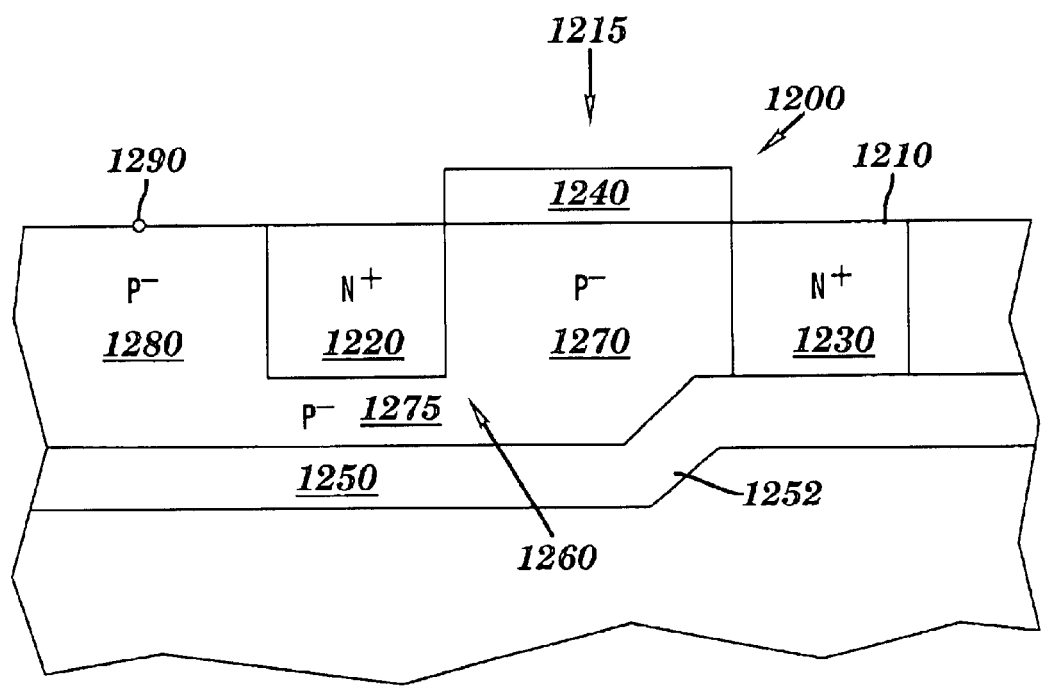
FIG. 13 depicts a cross-sectional view of an asymmetric semiconductor structure having a dual depth BOX and an FET, in accordance with the present invention.
Figure 14:
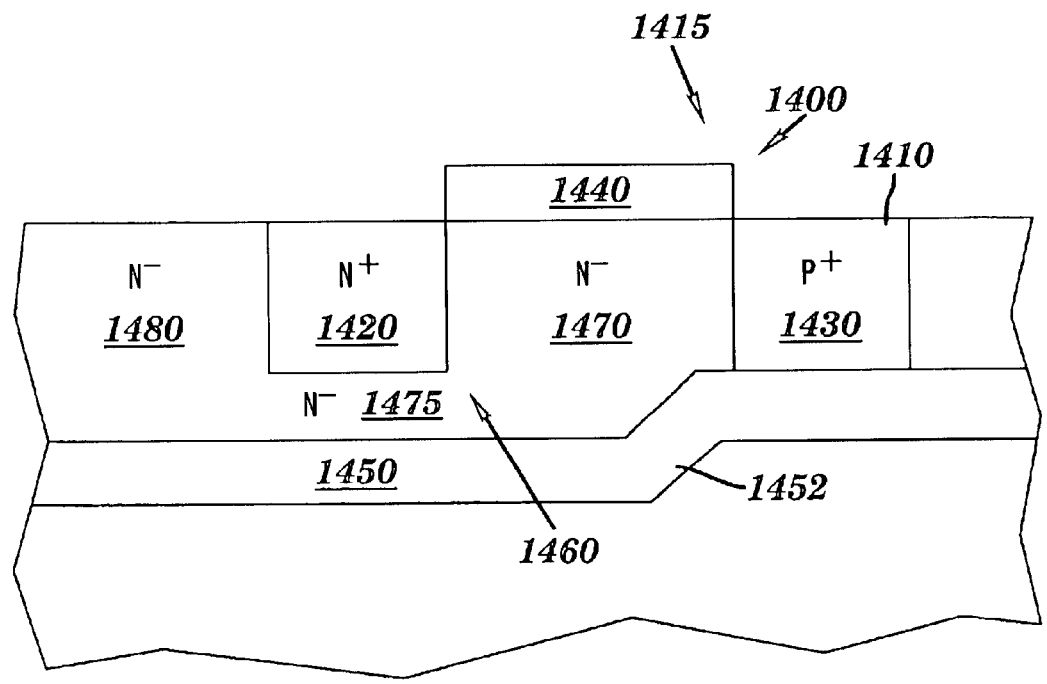
FIG. 14 depicts a cross-sectional view of an asymmetric semiconductor structure having a dual depth BOX and a gated lateral diode structure, in accordance with the present invention.
Figure 15:
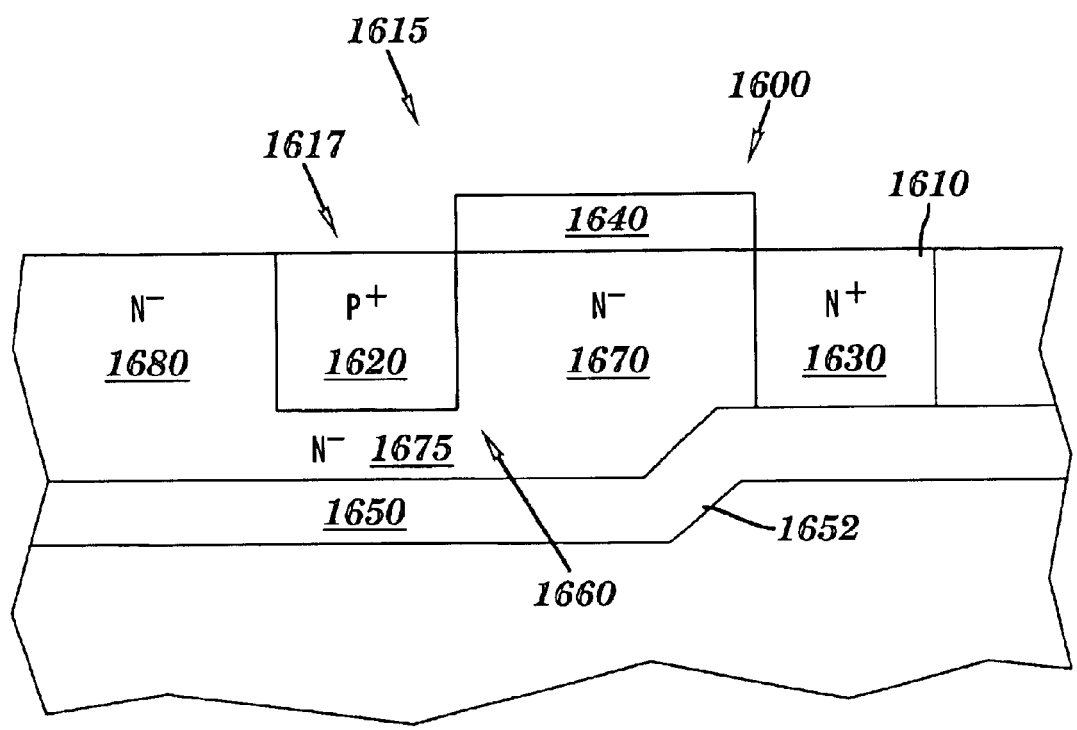
FIG. 15 depicts a cross-sectional view of an asymmetric semiconductor structure having a dual depth BOX, a gated lateral diode structure, and a vertical diode structure, in accordance with the present invention.

FIGS. 13–15 illustrate asymmetric semiconductor structures of the present invention. Each asymmetric semiconductor structure includes a dual depth BOX and two semiconductor regions such that one of the regions touches the BOX and the other region does not touch the BOX. Although a dual-depth BOX is shown in FIGS. 13–15 to illustrate asymmetric semiconductor structures, the BOX in each of FIGS. 13–15 may have any number of different depths, and may have a spatially varying thickness. Although a trench is not explicitly shown in FIGS. 13–15, one or more trenches could be inserted as necessary to provide lateral insulation between semiconductor devices, in a fashion consistent with the placement of trenches in FIGS. 2–12.

FIG. 13 illustrates a simplified cross-sectional view of a semiconductor structure of the present invention, relating to an FET. In FIG. 13, the substrate 1200 includes a top surface 1210, a dual-depth BOX 1250 having a transition region 1252 between the dual depths, and an FET 1215. The transition region 1252 divides the BOX 1250 into a first portion 1255 and a second portion 1256. The first portion 1255 is at a first depth $H_1$ relative to a point 1290 on the top surface 1210 of the substrate 1200. Definitionally, $H_1$ is the perpendicular distance between the point 1290 and the first portion 1255. The second portion 1256 is at a second depth $H_2$ relative to the point 1290. Definitionally, $H_2$ is the perpendicular distance between the point 1290 and the second portion 1256. The transition region 1252 causes $H_1$ and $H_2$ to differ in magnitude. The FET 1215 includes N+ material 1230, P– material 1270, N+ material 1220, and gate structure 1240. The source and drain of the FET 1215 may either comprise N+ material 1220 and N+ material 1230 respectively, or N+ material 1230 and N+ material 1220 respectively. The P– material 1270 serves as the channel of the FET 1215. The gate structure 1240 represents any gate structure, such as the gate structure 920 of FIG. 12. Also shown in FIG. 13 is an FET body 1260, comprising contiguous regions of the P– material 1270, P– material 1275, and P– material 1280. Two features of the semiconductor structure of FIG. 13 relates to the fact the N+ material 1230 touches the BOX 1250, while the N+ material 1220 does not touch the BOX 1250. A first feature stems from the fact that N+ material 1220 does not touch the BOX 1250, which allows the FET body 1260 to define an electrically conductive path from the channel of P– material 1270 to the point 1290 on the top surface 1210. This electrically conductive path, which would not exist if N+ material 1220 were touching the BOX 1250, permits P– material 1270 to be electrically coupled with any electronic device that is electrically connected to point 1290. A second feature is the asymmetry of junction capacitance associated with N+ material 1220 and N+ material 1230. In particular, the N+ material 1230 has little or no junction capacitance because it touches the BOX 1250. In contrast, the N+ material 1220 has a relatively high junction capacitance, because of the P– material 1275 existing between the N+ material 1220 and the BOX 1250. Low capacitance is advantageous for various applications including those requiring high-speed circuitry. High capacitance is advantageous for various applications, such as SRAM applications. Thus, the semiconductor structure of FIG. 13 allows low and high junction capacitance regions to coexist on the same substrate with a dual-depth BOX.

Many modifications of FIG. 13 are possible, as illustrated in the following three examples. In a first example, noting that the FET 1215 is an NFET, the FET 1215 would be a PFET if N+ material 1220, P– material 1270, N+ material 1230, P– material 1275, and P– material 1280 were respectively replaced by P+ material, N– material, P+ material, N– material, and N– material. In a second example, the FET 1215 would function as an NPN bipolar transistor if the gate structure 1240 were not utilized (e.g., see FIG. 16) and if a forward-biased voltage were applied between the base comprising P– material 1270 and the emitter comprising N+ material 1230, such that the N+ material 1220 would serve as the collector. In a third example, the semiconductor structure of FIG. 13 would represent a resistor structure if the gate structure 1240 were not utilized and if the P– material 1270, P– material 1275, and P– material 1280 were each replaced with N– material. As a consequence of the preceding substitutions, the N+ materials 1220 and 1230 would become electrical contacts, and the body 1260 would become a resistor.

FIG. 14 illustrates a simplified cross-sectional view of an asymmetric semiconductor structure of the present invention, relating to a lateral diode structure. In FIG. 14, the substrate 1400 includes a top surface 1410, a dual-depth BOX 1450 having a transition region 1452 between the dual depths, and a gated lateral diode 1415. The gated lateral diode 1415 includes P+ material 1430, N– material 1470, N+ material 1420, and gate structure 1440. The anode of the gated lateral diode 1415 includes P+ material 1430. The cathode of the gated lateral diode 1415 includes the N+ material 1420 and an N– body 1460. The N– body 1460 includes the contiguous regions of N– material 1470, N– material 1475, and N– material 1480. The gate structure 1440 represents any gate structure, such as the gate structure 920 of FIG. 12. By having N+ material 1420 not touching the BOX 1450, the gated lateral diode structure 1415 provides a low resistance path through N– region 1475, which improves the dissipation of heat from devices that protect chip circuits from electrostatic discharge (ESD). The gated lateral diode 1415 could be reconfigured to a lateral diode of opposite polarity if the P+ material 1430, N– material 1470, N+ material 1420, N– material 1475, and N– material 1480 were respectively replaced with N+ material, P– material, P+ material, P– material, and P– material. It is also permissible to omit the gate structure 1440, in which case the gated lateral anode 1415 would be an ungated lateral anode.

FIG. 15 illustrates a simplified cross-sectional view of an asymmetric semiconductor structure of the present invention, relating to a gated lateral diode structure and a vertical diode structure. In FIG. 15, the substrate 1600 includes a top surface 1610, a dual-depth BOX 1650 having a transition region 1652 between the dual depths, a gated lateral diode 1615, and a vertical diode 1617. The gated lateral diode 1615 includes an anode of P+ material 1620, and a cathode of N– material 1670, N+ material 1630, N– material 1675, and N– material 1680. The gate structure 1640 represents any gate structure, such as the gate structure 920 of FIG. 12. The vertical diode 1617 includes an anode of P+ material 1620 and a cathode of N– material 1675. The gated lateral diode 1615 and the vertical diode 1617 could be reconfigured to a gated lateral diode and a vertical diode, respectively, of opposite polarity if the N+ material 1630, N− material 1670, P+ material 1620, N− material 1675, and N− material 1680 were respectively replaced with P+ material, P− material, N+ material, P− material, and P− material. Thus the asymmetric semiconductor structure of FIG. 15 allows a gated lateral diode and a vertical diode to coexist on the same substrate with a dual-depth BOX. It is also permissible to omit the gate structure 1640, in which case the gated lateral diode 1615 would be an ungated lateral diode.

Figure 16:
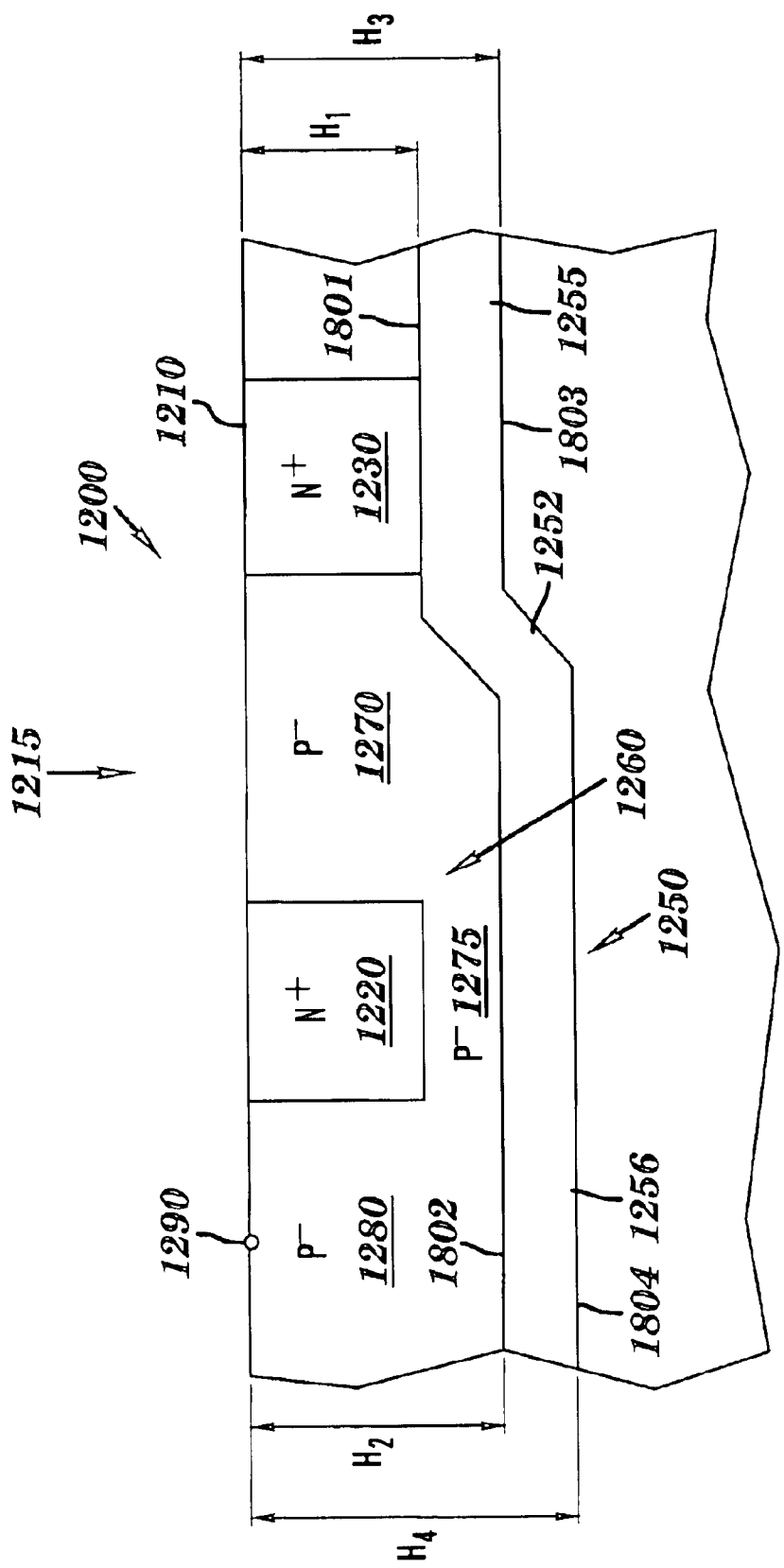
FIG. 16 depicts the semiconductor structure of FIG. 13 with the gate structure removed, in accordance with the present invention.

FIG. 16 depicts the semiconductor structure of FIG. 13 with the gate structure 1240 removed, in accordance with the present invention. In FIG. 16, the substrate 1200 includes a top surface 1210, a dual-depth BOX 1250 having a transition region 1252 between the dual depths. The transition region 1252 divides the BOX 1250 into a first portion 1255 and a second portion 1256. The first portion 1255 of the BOX 1250 has an upper boundary 1801 at a depth $H_1$ below a point 1290 on the first surface 1210 and a lower boundary 1803 at a depth $H_3$ below the point 1290. Definitionally, $H_1$ is the perpendicular distance between the point 1290 and the upper boundary 1801, and $H_3$ is the perpendicular distance between the point 1290 and the lower boundary 1803. The second portion 1256 of the BOX 1250 has an upper boundary 1802 at a depth $H_2$ below the point 1290 and a lower boundary 1804 at a depth $H_4$ below the point 1290. Definitionally, $H_2$ is the perpendicular distance between the point 1290 and the upper boundary 1802, and $H_4$ is the perpendicular distance between the point 1290 and the lower boundary 1804. The depths $H_1$, $H_2$, $H_3$, and $H_4$ are related to each other as follows: $H_3>H_1$, $H_4>H_2$, $H_2>H_1$, and $H_4>H_3$.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming a semiconductor structure, comprising the steps of:
    providing a substrate comprising a first surface;
    forming a continuous buried oxide layer within the substrate, wherein the buried oxide layer comprises a first portion and a second portion, wherein the first portion of the buried oxide layer has an upper boundary at a depth $H_1$ below a point on the first surface and a lower boundary at a depth $H_3$ below the point on the first surface, wherein the second portion of the buried oxide layer has an upper boundary at a depth $H_2$ below the point on the first surface and a lower boundary at a depth $H_4$ below the point on the first surface, wherein $H_3>H_1$, wherein $H_4>H_2$, wherein $H_2>H_1$, and wherein $H_4>H_3$; and
    after forming the buried oxide layer, forming a first trench isolation and a second trench isolation, wherein the first trench isolation has an upper boundary that touches and is coplanar with the first surface and a lower boundary that is located between the first surface and the first portion of the buried oxide layer, and wherein the second trench isolation has an upper boundary that touches and is coplanar with the first surface and a lower boundary that is located between the first surface and the second portion of the buried oxide layer, wherein the first trench isolation consists of one segment, wherein the second trench isolation includes two segments, and wherein the second trench isolation touches the second portion of the buried oxide layer.

2. The method of claim 1,
    wherein the first trench isolation does not touch the buried oxide layer.

3. The method of claim 1,
    wherein the first trench isolation touches the first surface of the buried oxide layer, and
    wherein the first trench isolation electrically isolates a first region within the substrate from a second region within the substrate.

4. The method of claim 3, further comprising forming a first semiconductor device in the first region and a second semiconductor device in a second region.

5. The method of claim 3,
    wherein the second trench isolation electrically isolates the second region within the substrate from a third region within the substrate.

6. The method of claims 5, further comprising forming a third semiconductor device in a third region.

7. The method of claim 1, wherein the step of forming a first trench isolation and a second trench isolation includes forming the first trench isolation during a first time interval and forming the second trench isolation during a second time interval, and wherein the first time interval and second time interval do not overlap.

8. The method of claim 1, wherein the step of forming a first trench isolation and a second trench isolation includes forming a portion of the first trench isolation and a portion of the second trench isolation concurrently.

9. The method of claim 1, wherein a sidewall of the first trench isolation is not perpendicular to the first surface.

10. A method for forming a semiconductor structure, comprising the steps of:
    providing a substrate comprising a first surface;
    forming a continuous buried oxide layer disposed within the substrate, wherein the buried oxide layer comprises a first portion and a second portion, wherein the first portion of the buried oxide layer has an upper boundary at a depth $H_1$ below a point on the first surface and a lower boundary at a depth $H_3$ below the point on the first surface, wherein the second portion of the buried oxide layer has an upper boundary at a depth $H_2$ below the point on the first surface and a lower boundary at a depth $H_4$ below the point on the first surface, wherein $H_3>H_1$, wherein $H_4>H_2$, wherein $H_2>H_1$, and wherein $H_4>H_3$;
    after forming the buried oxide layer, forming single step shallow trench isolation regions touching the first portion of the buried oxide layer for isolating devices formed between the first portion of the buried oxide layer and the first surface, wherein an upper boundary of each of said single step shallow trench isolation regions is coplanar with the first surface; and
    after forming the buried oxide layer, forming dual step shallow trench isolation regions selectively touching the buried oxide layer at the second portion of the buried oxide layer for isolating a group of devices formed between the second portion of the buried oxide layer and the first surface, wherein the group of devices includes at least one device, wherein an upper boundary of each of said dual step shallow trench isolation regions is coplanar with the first surface.

11. A method for forming a semiconductor structure comprising:

providing a substrate having a first surface;

forming a continuous buried oxide layer within the substrate, wherein the buried oxide layer comprises a first portion and a second portion, wherein the first portion of the buried oxide layer has an upper boundary at a depth $H_1$ below a point on the first surface and a lower boundary at a depth $H_3$ below the point on the first surface, wherein the second portion of the buried oxide layer has an upper boundary at a depth $H_2$ below the point on the first surface and a lower boundary at a depth $H_4$ below the paint on the first surface, wherein $H_3 > H_1$, wherein $H_4 > H_2$, wherein $H_2 > H_1$, and wherein $H_4 > H_3$;

forming a first semiconductor region between the first surface and the first portion of the buried oxide layer, wherein the first semiconductor region touches the first surface and touches the buried oxide layer at a first portion of the buried oxide layer, and wherein the first semiconductor region includes P+ semiconductor material;

forming a second semiconductor region between the first surface and the second portion of the buried oxide layer, wherein the second semiconductor region touches the first surface and does not touch the buried oxide layer, and wherein the second semiconductor region includes N+ semiconductor material;

forming a gate structure on the first surface, laterally between the first semiconductor region and the second semiconductor region; and forming a third semiconductor region between the first surface and the buried oxide layer, wherein the third semiconductor region is continuously distributed between the first surface and the buried oxide layer, wherein the third semiconductor region touches the buried oxide layer at the second portion of the buried oxide layer, the first semiconductor region, the second semiconductor region, and the gate structure, and wherein the third semiconductor region includes N− semiconductor material, wherein either the first semiconductor region and the second semiconductor region respectively include P+ semiconductor material and N+ semiconductor material or the first semiconductor region and the second semiconductor region respectively include N+ semiconductor material and P+ semiconductor material.

12. A method for forming a semiconductor structure comprising:

providing a substrate having a first surface;

forming a continuous buried oxide layer within the substrate, wherein the buried oxide layer comprises a first portion and a second portion, wherein the first portion of the buried oxide layer has an upper boundary at a depth $H_1$ below a point on the first surface and a lower boundary at a depth $H_3$ below the point on the first surface, wherein the second portion of the buried oxide layer has an upper boundary at a depth $H_2$ below the point on the first surface and a lower boundary at a depth $H_4$ below the point on the first surface, wherein $H_3 > H_1$, wherein $H_4 > H_2$, wherein $H_2 > H_1$, and wherein $H_4 > H_3$;

forming a first semiconductor region between the first surface and the first portion of the buried oxide layer, wherein the first semiconductor region touches the first surface and touches the buried oxide layer at a first portion of the buried oxide layer;

forming a second semiconductor region between the first surface and the second portion of the buried oxide layer, wherein the second semiconductor region touches the first surface and does not touch the buried oxide layer, and wherein there is no gate structure on the first surface laterally between the first semiconductor region and the second semiconductor region; and forming a third semiconductor region between the first surface and the buried oxide layer, wherein the third semiconductor region is continuously distributed between the first surface and the buried oxide layer, and wherein the third semiconductor region touches the buried oxide layer at the second portion of the buried oxide layer, the first semiconductor region, and the second semiconductor region.

13. The method of claim 12, wherein the first semiconductor region include N+ semiconductor material, wherein the second semiconductor region includes N+ semiconductor material, and wherein the third semiconductor region includes P− semiconductor material.

14. The method of claim 12, wherein the first semiconductor region includes P+ semiconductor material, wherein the second semiconductor region includes P+ semiconductor material, and wherein the third semiconductor region includes N− semiconductor material.

* * * * *